(12) United States Patent
Strickland et al.

(10) Patent No.: US 9,750,158 B2
(45) Date of Patent: Aug. 29, 2017

(54) REDUCED THERMAL TRANSFER TO PELTIER COOLED FETS

(71) Applicant: Honeywell International Inc., Morristown, NJ (US)

(72) Inventors: Peter Charles Strickland, Ottawa (CA); Sergiy Borysenko, Nepean (CA); Bradley Jessup, Ottawa (CA)

(73) Assignee: Honeywell International Inc., Morris Plains, NJ (US)

( * ) Notice: Subject to any disclaimer, the term of this patent is extended or adjusted under 35 U.S.C. 154(b) by 141 days.

(21) Appl. No.: 14/268,276

(22) Filed: May 2, 2014

(65) Prior Publication Data

US 2015/0319880 A1    Nov. 5, 2015

(51) Int. Cl.
*H05K 7/20* (2006.01)
*H05K 1/02* (2006.01)
*H05K 3/06* (2006.01)

(52) U.S. Cl.
CPC ............. *H05K 7/20* (2013.01); *H05K 1/0204* (2013.01); *H05K 1/0209* (2013.01); *H05K 3/06* (2013.01);
(Continued)

(58) Field of Classification Search
CPC .. H05K 1/02; H05K 1/18; H05K 3/06; H05K 7/20; H05K 2201/10121; H05K 1/0204; H05K 1/0201; H05K 1/0203; Y10T 29/49361; Y10T 29/49156; H01L 23/38; H01L 35/14; H04B 7/18506; H04B 7/18515; H04B 1/1027; H04B 1/109;
(Continued)

(56) References Cited

U.S. PATENT DOCUMENTS

| 5,451,720 A | 9/1995 | Estes et al. |
| 5,508,885 A | 4/1996 | Ishimoto |

(Continued)

FOREIGN PATENT DOCUMENTS

| DE | 4304654 | 8/1994 |

OTHER PUBLICATIONS

European Patent Office, "Extended European Search Report from EP Application No. 15163776.6 mailed Oct. 2, 2015", "from Foreign Counterpart of U.S. Appl. No. 14/268,276", Oct. 2, 2015, pp. 1-7, Published in: EP.

(Continued)

*Primary Examiner* — Anthony Haughton
*Assistant Examiner* — Matt Dhillon
(74) *Attorney, Agent, or Firm* — Fogg & Powers LLC

(57) ABSTRACT

A printed circuit board for use with a cooling device configured to cool at least one device is provided. The printed circuit board includes a substrate having a first surface and a second surface opposing the first surface; a ground plane on the first surface of the substrate, and circuitry in a circuit-region on the second surface of the substrate. The ground plane includes a patterned-region that is patterned with an array of holes. The circuitry is configured for use with the at least one device to be cooled. When a first side of the cooling device contacts the ground plane, and when the at least one device to be cooled contacts the circuitry, a reduced cross-sectional area of the patterned-region prevents heat from a second side of the cooling device from degrading performance of the at least one device.

10 Claims, 20 Drawing Sheets

(52) U.S. Cl.
CPC ............... *H05K 2201/062* (2013.01); *H05K 2201/09063* (2013.01); *H05K 2201/10121* (2013.01); *H05K 2201/10219* (2013.01); *Y10T 29/49156* (2015.01); *Y10T 29/49361* (2015.01)

(58) Field of Classification Search
CPC .. H04B 1/1081; H04B 15/00; H04B 10/2507; H04B 1/40
USPC ..... 361/709, 807; 343/702; 29/846, 890.035
See application file for complete search history.

(56) References Cited

U.S. PATENT DOCUMENTS

| | | | |
|---|---|---|---|
| 5,646,826 A * | 7/1997 | Katchmar | H01L 23/4006 165/185 |
| 5,708,566 A * | 1/1998 | Hunninghaus | H05K 1/0206 174/252 |
| 5,903,239 A * | 5/1999 | Takahashi | H01Q 1/22 333/247 |
| 5,969,421 A * | 10/1999 | Smooha | H01L 23/522 257/700 |
| 6,100,463 A * | 8/2000 | Ladd | H01L 35/34 136/201 |
| 6,205,028 B1 | 3/2001 | Matsumura | |
| 6,460,170 B1 * | 10/2002 | Shaeffer | H01R 9/096 257/2 |
| 6,800,886 B2 * | 10/2004 | Awano | B82Y 10/00 257/276 |
| 6,917,038 B2 | 7/2005 | Zheng et al. | |
| 6,921,972 B1 * | 7/2005 | Hashemi | H01L 23/3677 257/707 |
| 6,960,824 B1 * | 11/2005 | Hashemi | H01L 23/3677 257/698 |
| 7,161,239 B2 * | 1/2007 | Zhao | H01L 23/24 257/706 |
| 7,298,628 B2 * | 11/2007 | Panella | H05K 1/0262 361/760 |
| 7,881,072 B2 * | 2/2011 | Dibene, II | G06F 1/18 361/782 |
| 8,018,738 B2 * | 9/2011 | Doblar | H05K 1/0262 174/260 |
| 8,415,788 B2 * | 4/2013 | Li | H01L 23/3677 257/712 |
| 8,581,188 B2 | 11/2013 | Barbi et al. | |
| 8,593,819 B2 * | 11/2013 | de Rochemont | H01Q 1/362 174/258 |
| 8,659,903 B2 | 2/2014 | Schwartz | |
| 9,054,094 B2 * | 6/2015 | Anthony | H01L 23/49822 |
| 9,146,368 B2 * | 9/2015 | Chan | G02B 6/428 |
| 2003/0226688 A1 | 12/2003 | Jairazbhoy et al. | |
| 2008/0178920 A1 | 7/2008 | Ullo | |
| 2013/0118008 A1 * | 5/2013 | Gaynes | H05K 1/0206 29/836 |

OTHER PUBLICATIONS

"MAX1968 Evaluation Kit", Jun. 2002, pp. 1-11, Publisher: Maxim Integrated Products.

* cited by examiner

US 9,750,158 B2

REDUCED THERMAL TRANSFER TO PELTIER COOLED FETS

BACKGROUND

There is limited spectrum available for satellite communications. Thus, in order to maximize the use of the available spectrum, the throughput per Hertz is maximized. The low noise temperature of the cosmos in most satellite communication (SATCOM) bands is such that, when aircraft operate at high altitudes (where atmospheric losses are low), the noise temperature of the receiver becomes dominant in determining downlink throughput for a given aperture size. In most SATCOM receiver implementations, the Low Noise Amplifier (LNA) is a significant contributor to the overall receiver noise temperature. The noise temperature of the LNA is roughly proportional to the absolute temperature of the circuitry and active devices inside the LNA package. If the circuit losses at the input to the first (front end) field effect transistor (FET) are adequately low, the first FET is dominant in determining the LNA noise temperature.

Cooling of LNAs is routinely performed in Radio Astronomy using liquid nitrogen. However liquid nitrogen cooling is not practical for most aeronautical SATCOM products. Cooling of the first FET using Peltier devices (also called Transferred Electron Devices or thermoelectric cooling devices) has been done experimentally with limited success. The excessive transfer of heat from the hot side of the Peltier device to the FET and to the cold side of the Peltier device creates problems in cooling the FET.

SUMMARY

The present application relates to a printed circuit board for use with a cooling device configured to cool at least one device. The at least one device being at least one of an electronic device, an optical device, an electro-optic device, and a magnetic device. The printed circuit board includes a substrate having a first surface and a second surface opposing the first surface; a ground plane on the first surface of the substrate, and circuitry in a circuit-region on the second surface of the substrate. The ground plane includes a patterned-region that is patterned with an array of holes. The circuitry is configured for use with the at least one device to be cooled. When a first side of the cooling device contacts the ground plane, and when the at least one device to be cooled contacts the circuitry, a reduced cross-sectional area of the patterned-region prevents heat from a second side of the cooling device from degrading performance of the at least one device.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
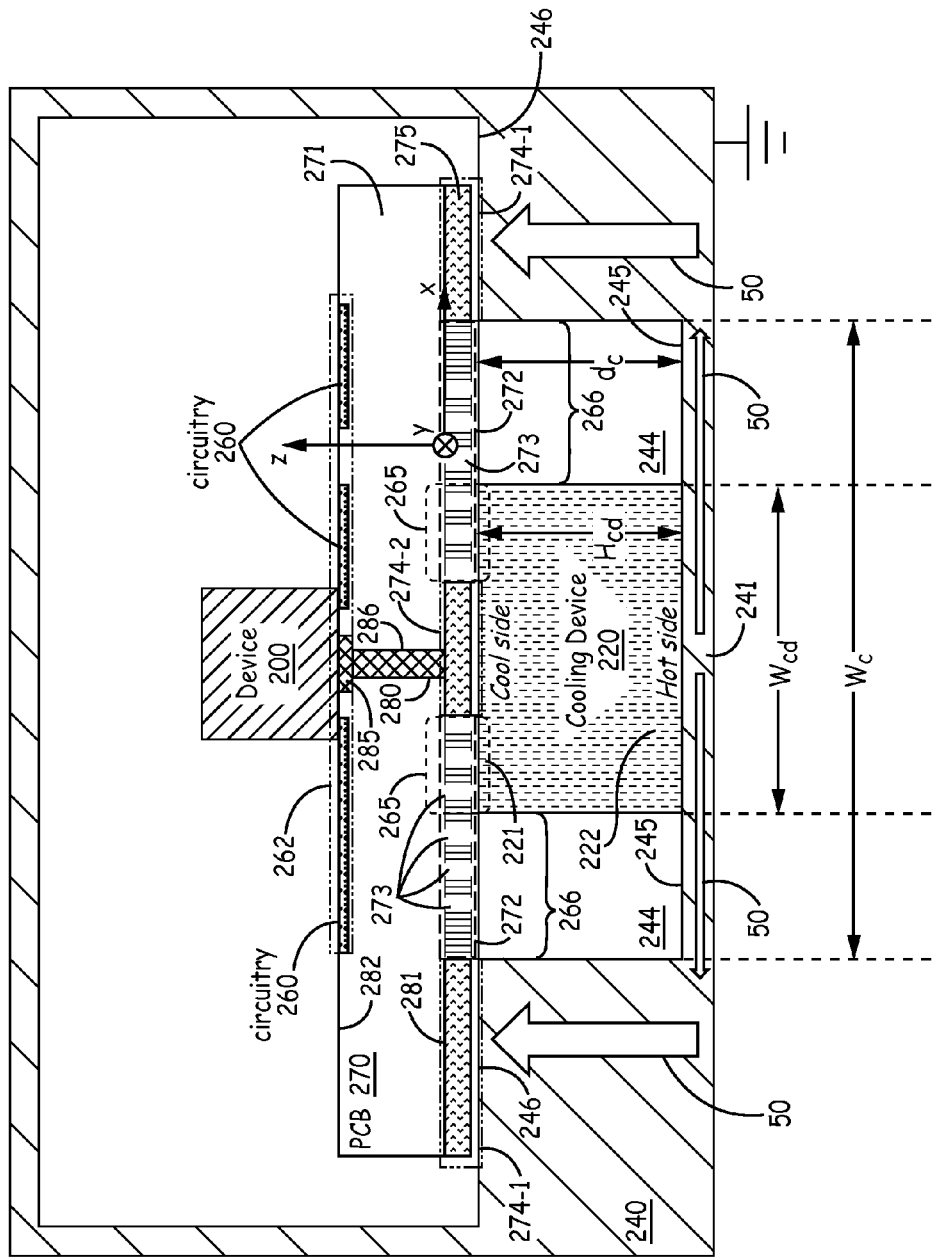
FIG. 1A is an embodiment of a printed circuit board for use with a cooling device configured to cool at least one device without degrading performance of the at least one device.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

In prior art systems, a cool side of a cooling device (e.g., a thermoelectric cooling (TEC) device) is attached to a ground plane side of the PCB opposing a device to be cooled (e.g., an FET), the ground plane is often the dominant thermal path for heat to enter the cooling device and the cool side of the cooling device. The temperature differential created by the cooling device is roughly inversely proportional to the thermal power that it must pump from the cold side.

The embodiments described below provide a printed circuit board configured to reduce thermal transfer of heat from a hot side of a cooling device to a device to be cooled and to a cold side of the cooling device. In order to reduce the thermal transfer through the ground plane without degrading the ground plane RF performance, an array of holes is patterned in the ground plane in the region that is: 1) under and close to the device to be cooled; and 2) close to or contacting the cooling device. The reduced cross-sectional area of the patterned area (due to the array of holes) mitigates the transfer of heat from a hot side of the cooling device, through a thermally conductive support structure, and through the ground plane of the printed circuit board to the device to be cooled. Likewise, the array of holes mitigates the transfer of heat from the hot side of the cooling device, through the thermally conductive material, through the ground plane that contacts the cooling device, to the cool side of the cooling device.

In one implementation of this embodiment, the printed circuit board is configured to reduce thermal transfer of heat from a hot side of a cooling device to a first field effect transistor (FET) in a low noise amplifier (LNA) to be cooled and to a cold side of a Peltier cooling device. As is known to one skilled in the art, a Peltier cooling device provides thermoelectric cooling using the Peltier effect to create a heat flux at the junction between two different types of materials. When DC current flows through the Peltier cooling device, heat is exchanged from one side to the other; one side gets cooler while the other side gets hotter. The hot side is attached to a heat sink and the cool side is attached to a device to be cooled. A Peltier device is also referred to herein as a thermoelectric cooler (TEC) device.

FIG. 1A is an embodiment of a printed circuit board (PCB) 270 for use with a cooling device 220 configured to cool at least one device 200. The at least one device 200 to be cooled is at least one of an electronic device, an optical device, an electro-optic device, and a magnetic device. For ease of viewing, only one device 200 is shown in FIG. 1A. The cooling device 220 and the device 200 to be cooled are opposite each other on opposing surfaces of the PCB 270.

The PCB 270 includes a dielectric substrate 271 having a first surface 281 and a second surface 282 opposing the first surface 281, a ground plane 275 on the first surface 281 of the dielectric substrate 271, and circuitry 260 on the second surface 282 of the dielectric substrate 271. The circuitry 260 is designed to operate the device 200 to be cooled. The device 200 to be cooled and the circuitry 260 to run the device 200 are a source of heat on the PCB 270.

Figure 1B:
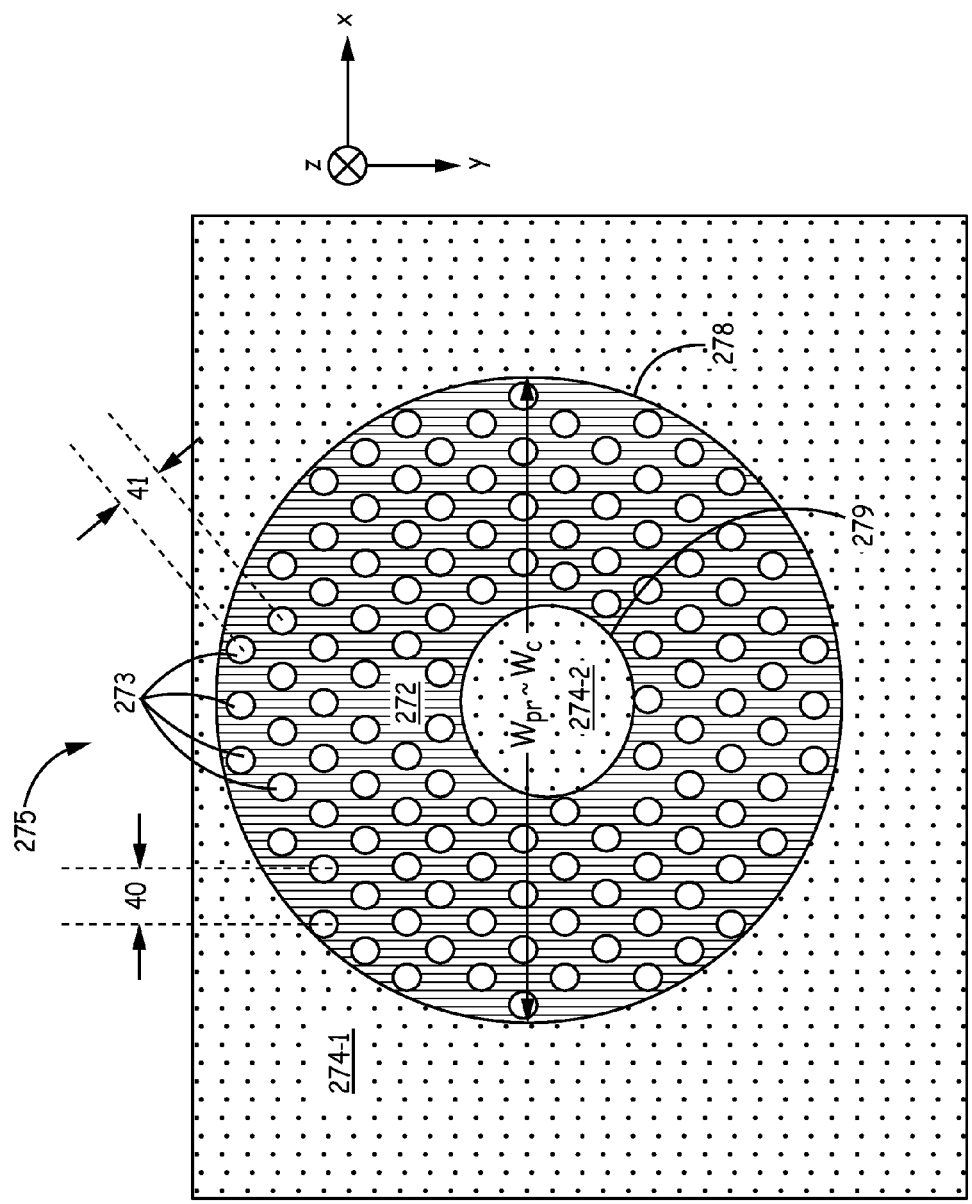
FIG. 1B shows a planar view of the exemplary ground plane on the printed circuit board of FIG. 1A.

FIG. 1B shows a planar view of the exemplary ground plane 275 on the printed circuit board 270 of FIG. 1A. In one implementation of this embodiment, the ground plane 275 is formed in copper. A patterned-region 272 of the ground plane 275 is patterned with an array of holes represented generally at 273. The ground plane 275 also includes at least one solid-region 274-1. As shown in FIG. 1B, the at least one solid-region include a first-solid-region 274-1 surrounding an outer perimeter 278 of the patterned-region 272 and a second-solid-region 274-2 surrounded by the patterned-region 272. An inner perimeter 279 of the patterned-region 272 surrounds the second-solid-region 274-2. The ground plane 275 abruptly transitions from the first-solid-region 274-1 to the patterned-region 272 at the outer perimeter 278 of the patterned-region 272. Likewise, the patterned-region 272 abruptly transitions to the second-solid-region 274-2 at an inner perimeter 279 of the patterned-region 272. Due to the holes 273, the cross-sectional area (in the x-y plane) of the patterned-region 272 is less than the cross-sectional area of the first-solid-region 274-1 and the second-solid-region 274-2. Thus, the cross-sectional area of the patterned-region 272 has a reduced cross-sectional area in the x-y plane. The terms "array of holes", "grid", and "mesh" are used interchangeably herein.

As shown in FIG. 1B, the second-solid-region 274-2 is a circularly shaped (in the x-y plane) solid-region 274-2 of the ground plane 275, which is surrounded by the annular shaped (in the x-y plane) patterned-region 272 patterned with the array of holes 273. In one implementation of this embodiment, the array of holes 273 in the patterned-region 272 does not surround a solid-region 274-2 of the ground plane 275. As shown in FIG. 1B, the holes 273 are circular in cross-section in the x-y plane. In another implementation of this embodiment, the holes 273 are rectangular in cross-section in the x-y plane. Other shapes for the second-solid-region 274-2 are possible. Other shapes for the patterned-region 272 are possible. Other shapes for the cross-sectional shape of the holes 273 are possible.

As shown in FIG. 1A, the inside perimeter 279 of the patterned-region 272 of the ground plane 275 is smaller than the mounting surface of the cooling device 220. The cooling device 220 is attached within this perimeter 279. In one implementation of this embodiment, the inside perimeter 279 of the patterned-region 272 of the ground plane 275 is approximately the same size as the mounting surface of the cooling device 220. In this latter embodiment, the cooling device 220 is mounted to the second-solid-region 274-2 of the ground plane 275.

The ground plane 275 is attached to the cooling device 220 by any currently available or future available techniques for attaching. For example, the second-solid-region 274-2 and a portion 265 of the patterned-region 272 of the ground plane 275 are attached to the cooling device 220 by soldering, direct contact, thermally conductive adhesive, or contact through a thermal transfer compound.

As shown in FIG. 1A, the circuitry 260 is in a circuit-region 262 that opposes the second-solid-region 274-2 and the patterned-region 272 of the ground plane 275. The circuitry 260 is grounded to the second-solid-region 274-2 of the ground plane 275 via a ground connection 280. The ground connection 280 electrically connects the device 200 to the second-solid-region 274-2 of the ground plane 275 through the dielectric substrate 271. The ground connection 280 includes a pad 285 attached to the device 200 and a via 286 that extends through the dielectric substrate 271. The via 286 contacts the second-solid-region 274-2 of the ground plane 275. In an embodiment in which there is no second-solid-region 274-2 of the ground plane 275, the via 286 of the ground connection 280 contacts the patterned-region 272 of the ground plane 275.

As shown in the embodiment of FIG. 1A, the cooling device 220 is positioned in a cavity 244 formed in a thermally conductive structure 240. In this embodiment, the thermally conductive structure 240 houses the printed circuit board (PCB) 270, the cooling device 220, and the device 200 to be cooled. The cavity 244 has a bottom surface 245. The structure 240 is formed from a thermally conductive material, such as aluminum or other metals. The height $H_{cd}$ of the cooling device 220 is equal to the depth $d_c$ of the cavity 244. The width $W_c$ of the cavity 244 is greater than the width $W_{cd}$ of the cooling device 220. As shown in FIGS. 1A and 1B, the width $W_c$ of the cavity 244 is about equal to the width $W_{pr}$ of the patterned-region 272. The PCB 270 is operably positioned on the thermally conductive structure 240. As shown in FIG. 1A, the first-solid-region 274-1 of the ground plane 275 contacts a surface 246 (also referred to as second surface 246) of the structure 240 at a perimeter (i.e., the top edge) of the cavity 244 in the structure 240. The cooling device 220 contacts the second-solid-region 274-2 and the portion 265 of the patterned-region 272. Another portion 266 of the patterned-region 272 is over the unfilled area of the cavity 244. This other portion 266 of the patterned-region 272 also reduces the flow of heat to the cooling device 220 and to the via 286 of the ground connection 280. The heat flow in the thermally conductive structure 240 is indicated by the arrows 50.

As shown in FIG. 1A, the cooling device 220 has a cool side 221 (also referred to herein as a first side 221) and a hot side 222 (also referred to herein as a second side 222). When the cooling device 220 is operational to cool the device 200, the cooling device 220 is positioned with the hot side 222 contacting the bottom surface 245 of the cavity 244. When the cooling device 220 is operational to cool the device 200, a region 241 of the thermally conductive structure 240 in contact with the hot side 222 of the cooling device 220 (i.e., a portion of the bottom surface 245 of the cavity 244) is heated. The region 241 of the thermally conductive structure 240 in contact with the hot side 222 of the cooling device 220 is referred to herein as a heated region 241 of the structure 240.

The heat 50 flows through the thermally conductive material of the structure 240 from the heated region 241 of the structure 240 to the solid-region 274 of the ground plane 275 that contacts the structure 240. When the first side 221 of the cooling device 220 contacts the portion 265 of the patterned-region 274 of the ground plane 275, and when the at least one device 200 to be cooled contacts the circuitry 260, the reduced cross-sectional area of the patterned-region 274 contacting (i.e., portion 265) and adjacent to (i.e., portion 266) the cooling device 220 prevents heat 50 from the hot side 222 of the cooling device 220 from degrading the performance of the at least one device 200. The array of holes 273 mitigates the transfer of heat 50 from the hot side 222 of the cooling device 220, through the thermally conductive structure 240, through the ground plane 275 of the PCB 270 to the device 200 to be cooled. Likewise, the array of holes 273 mitigates the transfer of heat 50 from the hot side 222 of the cooling device 220, through the thermally conductive structure 240, through the ground plane 275 of the PCB 270, to the cool side 221 of the cooling device 220.

In one implementation of this embodiment, the dimensions, in the x-y plane, of the patterned-region 272 of the ground plane 275 are several times larger than the dimensions, in the x-y plane, of the cool side 221 of the cooling device 220 attached to the ground plane 275. Typically, the dimensions, in the x-y plane, of cooled device 200 are much smaller than the dimensions, in the x-y plane, of the cooling device 220.

As shown in FIG. 1A, the diameter $W_{pr}$ (FIG. 1B) of the patterned-region 272 is wider than extent (in the x direction) of the circuitry 160. The diameter of the second-solid-region 274-2 is less than the extent (in the x direction) of the device 200. In one implementation of this embodiment, the surface area (in the x-y plane) of the device 200 is 2 mm$^2$, the surface area (in the x-y plane) of the cooling device 220 is 4 mm$^2$, and the diameter $W_{pr}$ (FIG. 1B) of the patterned-region 272 is 10 mm.

In one implementation of this embodiment, the device 200 to be cooled requires (or produces) electro-magnetic fields that propagate within the dielectric substrate 271 of the PCB 270. In this case, the spacing 40 or 41 (FIG. 1B) between neighboring holes 273 in the array of holes 273 is less than a quarter wavelength of the electro-magnetic waves propagating in the dielectric substrate 271 of PCB 270. In this manner, the array of holes are designed to: 1) terminate electric field lines between the device 200 to be cooled and other circuitry 260 with as little perturbation as possible; 2) reduce the cross-sectional area of the ground plane 275 contacting the cool side 221 of the cooling device 220; and 3) reduce the cross-sectional area of the ground plane 275 adjacent to the device 200 to be cooled (i.e., a heat source).

Figure 2A:
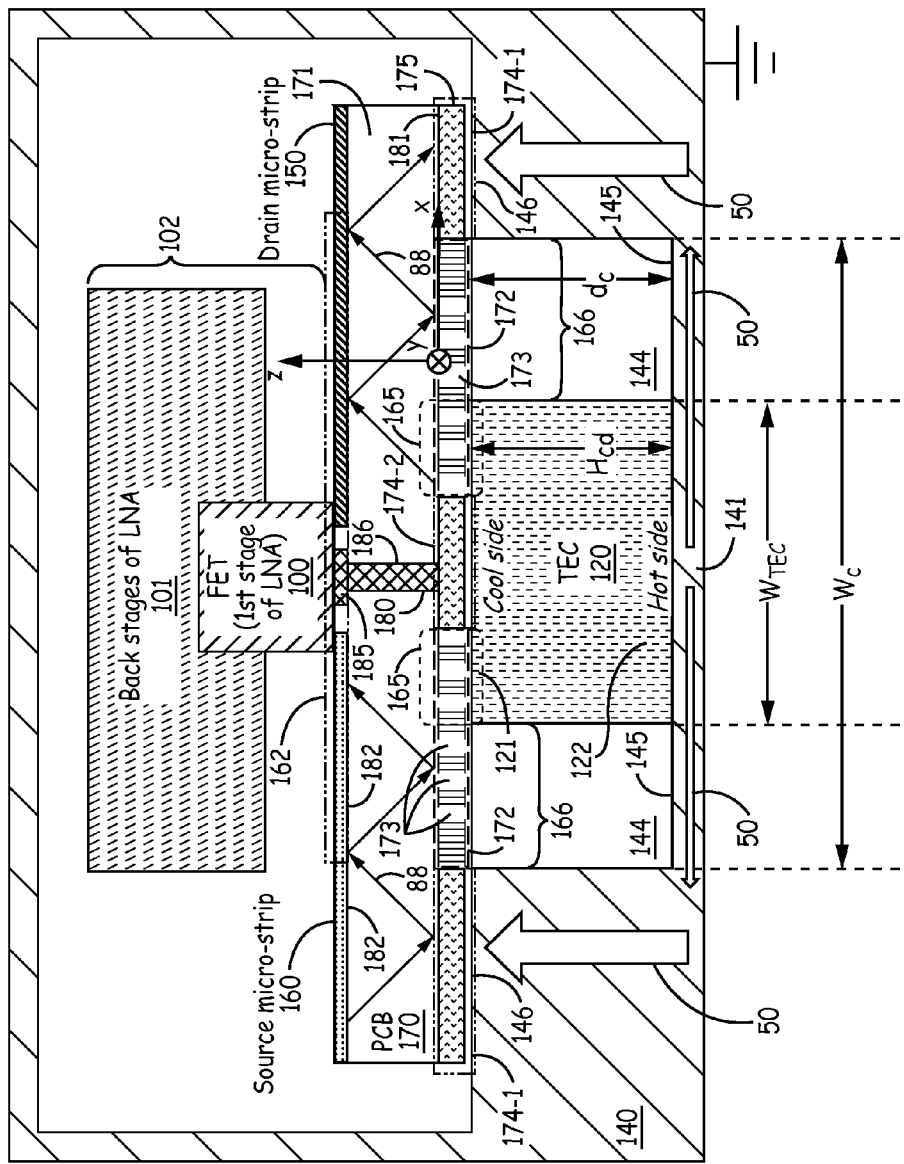
FIG. 2A is an embodiment of a printed circuit board for use with a thermo-electric cooling device configured to cool at least one field effect transistor without degrading performance of the at least one field effect transistor device.

FIG. 2A is an embodiment of a printed circuit board (PCB) 170 for use with a thermo-electric cooling (TEC) device 120 configured to cool at least one field effect transistor (FET) 100. As shown in FIG. 1A, the FET 100 is a first stage of a low noise amplifier (LNA) 102. The LNA 102 includes the FET 100 and the back stages 101 of the LNA 102. The FET 100 is a first FET 100 in the LNA 102 and must be cooled to limit the noise in the LNA 102.

The PCB 170 is similar in structure and function to the PCB 270 of FIG. 1A. Specifically, the PCB 170 includes a dielectric substrate 171, having a first surface 181 and a second surface 182 opposing the first surface 181, a ground plane 175 on the first surface 181 of the dielectric substrate 171, and circuitry on a second surface 182 of the dielectric substrate 171. The circuitry for the FET 100 includes a source microstrip 160, a drain micro-strip 150, and the pad 185 for the ground connection 180. The pad 185 functions as a gate for the FET 100. The FET 100 to be cooled and the source microstrip 160, the drain micro-strip 150, and the ground connection 180 to run the FET 100 are a source of heat.

Although the FET 100 is shown to be cooled by means of a TEC device 120 attached to the ground plane beneath the PCB 170, other coolers can be used as is understandable to one skilled in the art. For example, the TEC device 120 can be replaced by a small mechanical cryogenic device with cooling fingers, or heat pipe connections from an arbitrary cooling source. The terms "TEC device" and "TEC" are used interchangeably herein.

Figure 2B:
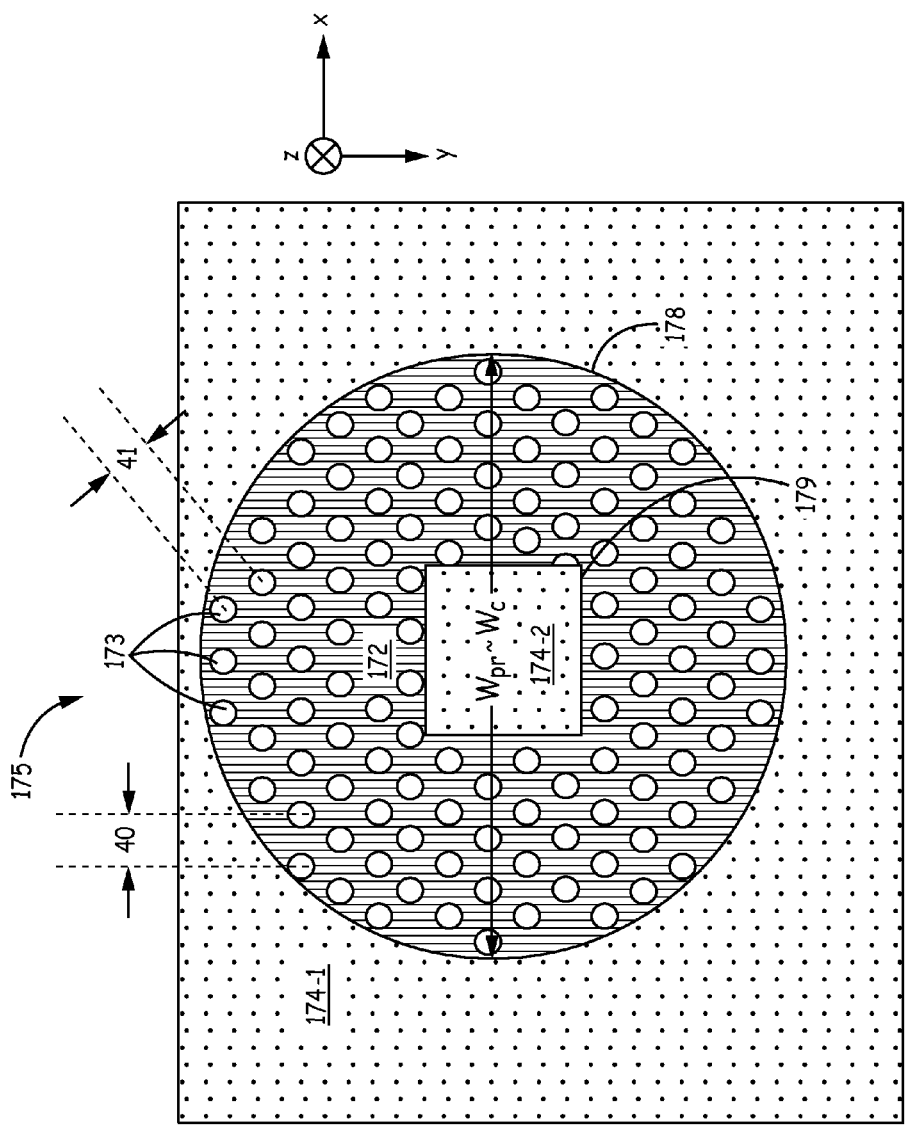
FIG. 2B shows a planar view of an embodiment of the ground plane on the printed circuit board of FIG. 2A.

FIG. 2B shows a planar view of the exemplary ground plane 175 on the printed circuit board 170 of FIG. 2A. In one implementation of this embodiment, the ground plane 175 is formed in copper. A patterned-region 172 of the ground plane 175 is patterned with an array of holes represented generally at 173. The ground plane 175 also includes at least one solid-region 174-1. As shown in FIG. 2B, the at least one solid-region includes a first-solid-region 174-1 surrounding an outer perimeter 178 of the patterned-region 172 and a second-solid-region 174-2 surrounded by the patterned-region 172. An inner perimeter 179 of the patterned-region 172 surrounds the second-solid-region 174-2. The ground plane 175 abruptly transitions from the first-solid-region 174-1 to the patterned-region 172 at the outer perimeter 178 of the patterned-region 172. Likewise, the patterned-region 172 abruptly transitions to the second-solid-region 174-2 at an inner perimeter 179 of the patterned-region 172. Due to the holes 173, the cross-sectional area (in the x-y plane) of the patterned-region 272 is less than the cross-sectional area of the first-solid-region 274-1 and the second-solid-region 274-2. Thus, the cross-sectional area of the patterned-region 272 has a reduced cross-sectional area.

As shown in FIG. 2B, a solid-region 174-2 of the ground plane 175 has a rectangular shape in the x-y plane. Other shapes for the second-solid-region 174-2 of the ground plane 175 are possible. Other shapes for the patterned-region 172 are possible. In one implementation of this embodiment, the array of holes 173 in the patterned-region 172 does not surround a solid-region 174-2 of the ground plane 175. As shown in FIG. 2B, the holes 173 are circular in cross-section in the x-y plane. In another implementation of this embodiment, the holes 173 are rectangular in cross-section in the x-y plane. Other shapes for the cross-section of the holes 173 are possible.

As shown in FIG. 2A, the inside perimeter 179 of the patterned-region 172 of the ground plane 175 is smaller than the mounting surface of the TEC device 120. The TEC device 120 is attached within this perimeter. In one implementation of this embodiment, the inside perimeter 179 of the patterned-region 172 of the ground plane 175 is approximately the same size and shape as the mounting surface of the TEC device 120. In this latter embodiment, the TEC device 120 is mounted to the second-solid-region 174-2 of the ground plane 175.

The ground plane 175 is attached to the TEC device 120 by any currently available or future available techniques for attaching. For example, the second-solid-region 174-2 and a portion 165 of the patterned-region 172 of the ground plane 175 are attached to the TEC device 120 by soldering, direct contact, thermally conductive adhesive, or contact through a thermal transfer compound.

As shown in FIG. 2A, the source microstrip 160 and the drain micro-strip 150 are in a circuit-region 162 that opposes the second-solid-region 174-2 and the patterned-region 172 of the ground plane 175. The FET 100 is grounded to the second-solid-region 174-2 of the ground plane 175 via a ground connection 180 (gate 180). The ground connection 180 electrically connects the source microstrip 160, the drain micro-strip 150, and the FET 100 to the second-solid-region 174-2 of the ground plane 175 through the dielectric substrate 171. The ground connection 180 includes a pad 185 attached to the device 200 and a via 186 that extends through the dielectric substrate 171. The via 186 contacts the second-solid-region 174-2 of the ground plane 175. In an embodiment in which there is no second-solid-region 174-2 of the ground plane 175, the via 186 of the ground connection 180 contacts the patterned-region 172 of the ground plane 175.

As shown in the embodiment of FIG. 2A, the TEC device 120 is positioned in a cavity 144 formed in a thermally conductive structure 140. In this embodiment, the thermally conductive structure 140 houses the PCB 170, the TEC device 120, and the LNA 102 including the FET 100 to be cooled. The cavity 144 has a bottom surface 145. The structure 140 is formed from a thermally conductive material, such as metal. The height $H_{TEC}$ of the TEC device 120 is equal to the depth $d_c$ of the cavity 144. The width $W_c$ of the cavity 144 is greater than the width $W_{TEC}$ of the TEC device 120. As shown in FIGS. 2A and 2B, the width $W_c$ of the cavity 144 is about equal to the width $W_{pr}$ of the patterned-region 172. The PCB 170 is operably positioned on the thermally conductive structure 140. As shown in FIG. 1A, the first-solid-region 174-1 of the ground plane 175 contacts a surface 146 (also referred to herein as second surface 146) of the structure 140 at a perimeter (i.e., the top edge) of the cavity 144 in the structure 140. The TEC device 120 contacts the second-solid-region 174-2 and the portion 165 of the patterned-region 172. Another portion 166 of the patterned-region 172 is over the unfilled area of the cavity 144. This other portion 166 of the patterned-region 272 also reduces the flow of heat to the TEC device 120 and the via 186 of the ground connection 180. The heat flow in the structure 140 is indicated by the arrows 50.

As shown in FIG. 2A, the TEC device 120 has a cool side 121 (also referred to herein as a first side 121) and a hot side 122 (also referred to herein as a second side 122). When the TEC device 120 is operational to cool the FET 100, the TEC device 120 is positioned with the hot side 122 contacting the bottom surface 145 of the cavity 144. When the TEC device 120 is operational to cool the FET 100, a region 141 of the thermally conductive structure 140 in contact with the hot side 122 of the TEC device 120 (i.e., the region of the structure 140 adjacent to the bottom surface 145 of the cavity 144) is heated. The region 141 of the thermally conductive structure 140 in contact with the hot side 122 of the TEC device 120 is referred to herein as a heated region 141 of the structure 140.

The heat 50 flows through the thermally conductive material of the structure 140 from the heated region 141 of the structure 140 to the solid-region 174 of the ground plane 175 that contacts the structure 140. The configuration of the PCB 170 in the structure 140 prevents the flow of heat 50 from the hot side of the TEC device 120 from degrading the performance of the LNA 102. First, the portion 166 of the reduced cross-sectional area of the patterned-region 174 mitigates the amount of heat 50 from the hot side 122 of the TEC device 120 that reaches the cool side 121 of the TEC device 120. Second, the portion 165 of the reduced cross-sectional area of the patterned-region 174 that contacts the cool side 121 of the TEC device 120 also prevents heat 50 from the hot side 122 of the TEC device 120 from heating the cool side 121. If the cool side 121 becomes heated, the performance of the FET 100 is degraded. Specifically, the array of holes 173 mitigates the transfer of heat 50 from the hot side 122 of the TEC device 120, through the thermally conductive structure 140, through the ground plane 175 of the PCB 170 to the FET 100 to be cooled. Likewise, the array of holes 173 mitigates the transfer of heat 50 from the hot side 122 of the TEC device 120, through the thermally conductive structure 140, through the ground plane 175 of the PCB 170, to the cool side 121 of the TEC device 120. Additionally, the portions 166 and 165 of the reduced cross-sectional area of the patterned-region 174 also mitigate the amount of heat 50 that radiates from the ground plane 175 to the source microstrip 160 and drain micro-strip 150.

In one implementation of this embodiment, the dimensions, in the x-y plane, of the patterned-region 172 of the ground plane 175 are several times larger than the dimensions, in the x-y plane, of the cool side 121 of the TEC device 120 attached to the ground plane 175. Typically, the dimensions, in the x-y plane, of cooled FET 100 are much smaller than the dimensions, in the x-y plane, of the TEC device 120. The diameter of the second-solid-region 274-2 is less than the extent (in the x direction) of the FET 100. In one implementation of this embodiment, the surface area (in the x-y plane) of the FET 100 is 2 mm$^2$, the surface area (in the x-y plane) of the TEC device 120 is 4 mm$^2$, and the diameter $W_{pr}$ (FIG. 2B) of the patterned-region 172 is 10 mm.

In one implementation of this embodiment, the FET 100 to be cooled requires (or produces) electro-magnetic fields represented generally at 88 that propagate within the dielectric substrate 171 of the PCB 170. In this case, the spacing 40 or 41 (FIG. 2B) between neighboring holes 173 in the array of holes 173 is less than a quarter wavelength of the electro-magnetic waves propagating in the PCB 170. In this manner, the array of holes are designed to: 1) terminate electric field lines between the FET 100 to be cooled and other source microstrip 160 and drain micro-strip 150 with as little perturbation as possible; 2) reduce the cross-sectional area of the ground plane 175 contacting the cool side 121 of the TEC device 120; and 3) reduce the cross-sectional area of the ground plane 175 adjacent to the FET 100 to be cooled (i.e., a heat source).

In one implementation of this embodiment, the FET 100 to be cooled is part of a cooled Low Noise Amplifier (LNA) 102 in K band, for use in satellite communications. In this case, a PHEMT device 100 is attached to the PCB 170. The PCB 170 is very thin to avoid excessive thermal conduction through the dielectric substrate 171.

Figure 2C:
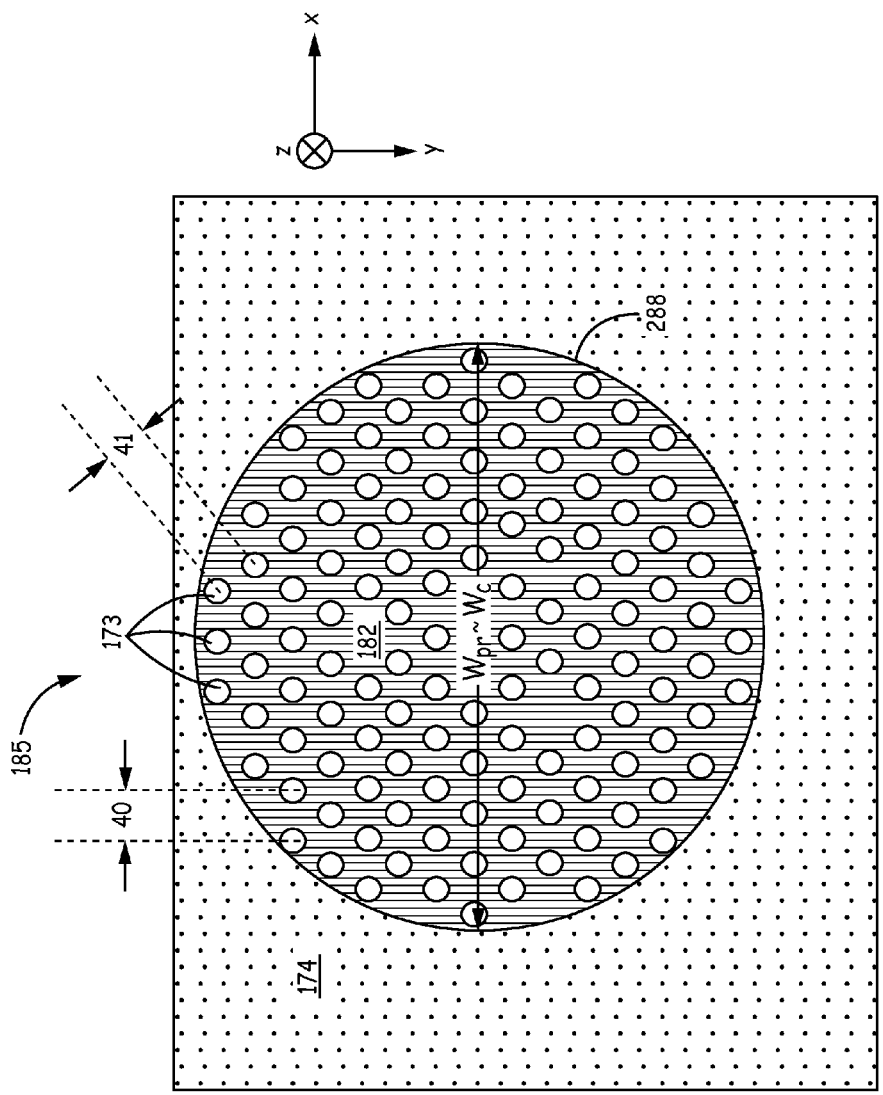
FIG. 2C shows a planar view of an embodiment of the ground plane on a printed circuit board for use with a cooling device configured to cool at least one device without degrading performance of the at least one device.

FIG. 2C shows a planar view of an embodiment of the ground plane 185 on a printed circuit board. In this alternate embodiment, the at least one solid-region 174 of the ground plane 185 is a single solid-region 174. The solid-region 174 surrounds the perimeter 288 of the patterned-region 182. If this embodiment is implemented to cool the device 200 shown in FIG. 1A, the ground plane 185 replaces the ground plane 275 shown in FIG. 1A. In this case, the ground connection 280 electrically connects the circuitry 260 to the patterned-region 182 of the ground plane 185 through the dielectric substrate 271 of the PCB 170. Likewise, if this embodiment is implemented to cool the FET 100 shown in FIG. 2A, the ground plane 185 replaces the ground plane 175 shown in FIG. 2A. In this case, the ground connection 180 electrically connects the source microstrip 160 and drain micro-strip 150 to the patterned-region 182 of the ground plane 185 through the dielectric substrate 171 of the PCB 170.

Figure 2D:
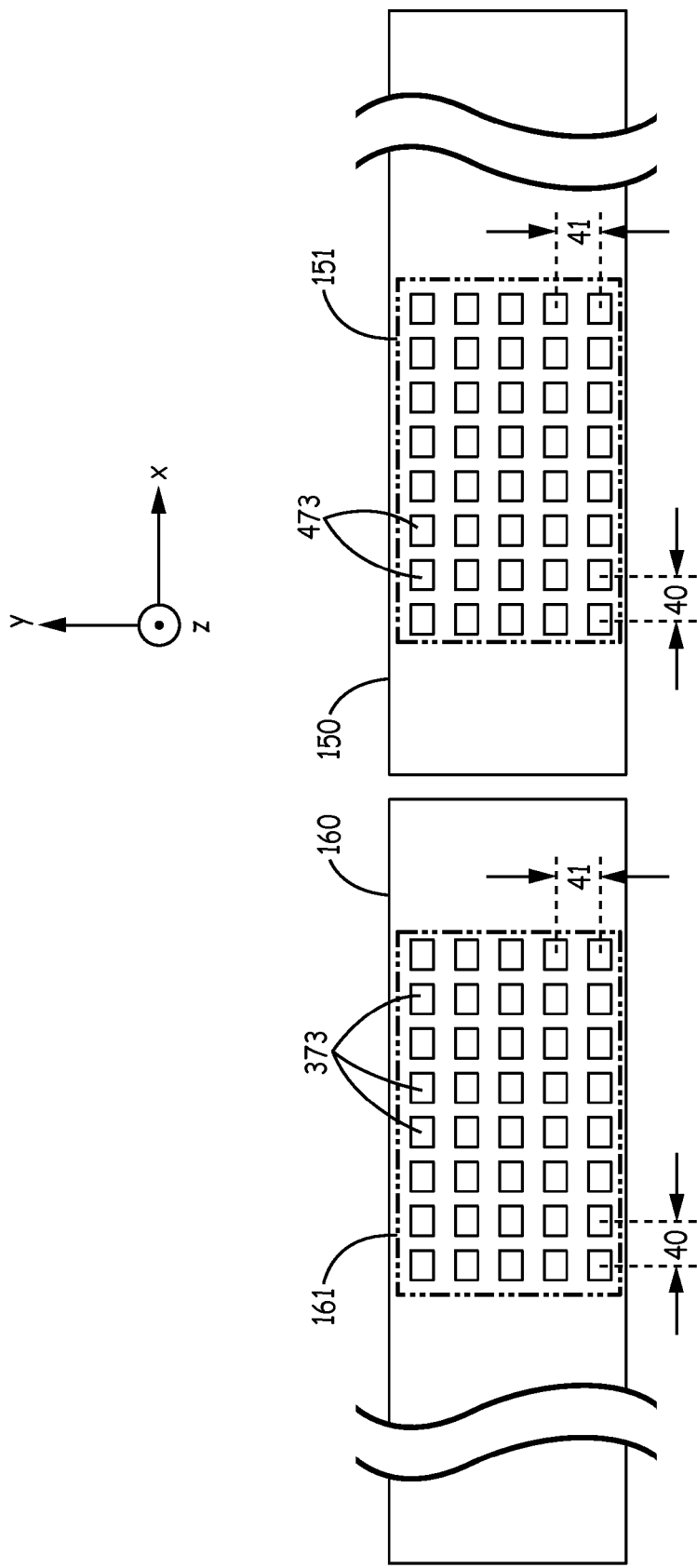
FIG. 2D shows a planar view of an embodiment of a source microstrip and a drain micro-strip on a printed circuit board including circuitry-patterned-regions patterned with arrays of holes.

In one implementation of this embodiment, the circuitry (e.g., the source microstrip 160 and a drain micro-strip 150) can be patterned with an array of holes to reduce the cross-sectional area of the source microstrip 160 and the drain micro-strip 150. FIG. 2D shows a planar view of an embodiment of a source microstrip 160 and a drain microstrip 150 on a printed circuit board 170 including circuitry-patterned-regions patterned with arrays of holes. The source microstrip 160 has a circuitry-patterned-region 161 with patterned with an array of holes 373 (also referred to herein as grid 373). The array of holes 373 has a periodic spacing 40 (pitch) in the x direction and a periodic spacing 41 (pitch) in the y direction. The drain micro-strip 150 has a circuitry-patterned-region 151 with patterned with an array of holes 473 (also referred to herein as grid 473). The array of holes 473 has a periodic spacing 40 in the x direction and a periodic spacing 41 in the y direction. The spacings 40 and 41 are designed to be less than one quarter of the wavelength of the radiation propagating in the source microstrip 160 and the drain microstrip 150.

For microstrip lines connected to the FET on the top surface of the substrate 171 the electromagnetic impact is primarily dependent upon the pitch of the array of holes 373 and 473 relative to the shortest wavelength propagated by the RF circuit and the thickness (extent in the z direction) of the PCB 270. If the pitch is sufficiently fine, the grids 373 and 473 have negligible impact on the characteristics of the source microstrip 160 and the drain micro-strip 150, respectively. As the pitch increases, the impedance of the microstrip lines increases and eventually, for unacceptably large pitch, the grids 373 and 473 begin to radiate from the ground plane side of the PCB 270.

Appropriate design considerations for the array of holes 173 or 273 in the ground plane 175 are now described with reference to the embodiment of the PCB 170 shown in FIGS. 2A and 2B. The design for the ground plane 275 in the PCB 270 shown in FIGS. 1A and 1B is subjected to the same design considerations based on the device 200 and the application in which the device 200 is being used.

FIGS. 3-6 show various types of grids. FIGS. 7-10 show plots of the reflection response (S11) as a function of frequency for the grid types of FIGS. 3-6, respectively. FIGS. 11-14 show plots of the transmission response (S21) as a function of frequency for the grid types of FIGS. 3-6, respectively. The plots shown in FIG. 7-14 are based on software modelling of the grids shown in FIGS. 3-6. The reflection response (S11) and the transmission response (S21) correspond to the fundamental mode on the microstrip line. In this case the microstrip line crosses the grid without a FET in place. The reflection and transmission characteristics are shown for a 1 mm wide microstrip line on a 0.127 mm thick Rogers RT5880 substrate having 5 oz/ft$^2$ metallization. A Rogers 5880 PTFE substrate has thermal conductivity of 0.2 W/m-K. Copper has a thermal conductivity of 400 W/m-K. The parameters plotted in FIGS. 7-14 described below are modelled for a 0.5 oz ground plane with a thickness of 0.0007". In this case, the ground plane transfers 56 times as much thermal power as the substrate if the two are terminated at identical temperatures. Considerable thermal power may also be transferred through the source microstrip 160, a drain micro-strip 150, and a ground connection 180, which are also typically copper (below any additional plating) if these have significant widths.

The one implementation the array of holes 173 is a simple grid (such as, a checkerboard pattern) within some region about the TEC 120 and FET 100. The close proximity of the conductive lines of the pattern is such that field lines need not bend significantly to be terminated. This can be achieved with some desired ratio of metal (e.g., copper) to gap. The pitch of the grid, which is the spacing 40 and 41 shown in FIG. 2B, is less than the wavelength at the highest frequency of operation. Other copper patterns can achieve a similar result but retain the common feature of gaps much smaller than the wavelength with the desired ratio of copper being implemented. In designing a ground plane 175 with an array of holes 173 to reduce thermal transfer, a thermal analysis and an electromagnetic analysis are performed on the selected pattern. Reliability and manufacturability of the fine lines within the mesh must also be considered.

A variety of software packages, such as Momentum or Sonnet are currently available to perform EM analysis of the grid adjacent to a waveguide in which EM fields propagate. Similarly many CAD tools are currently available to perform the thermal analysis of the thermal flow in the various embodiments of the structures described herein. CST Studio Suite is currently available to perform both the thermal and EM analysis.

Figure 3:
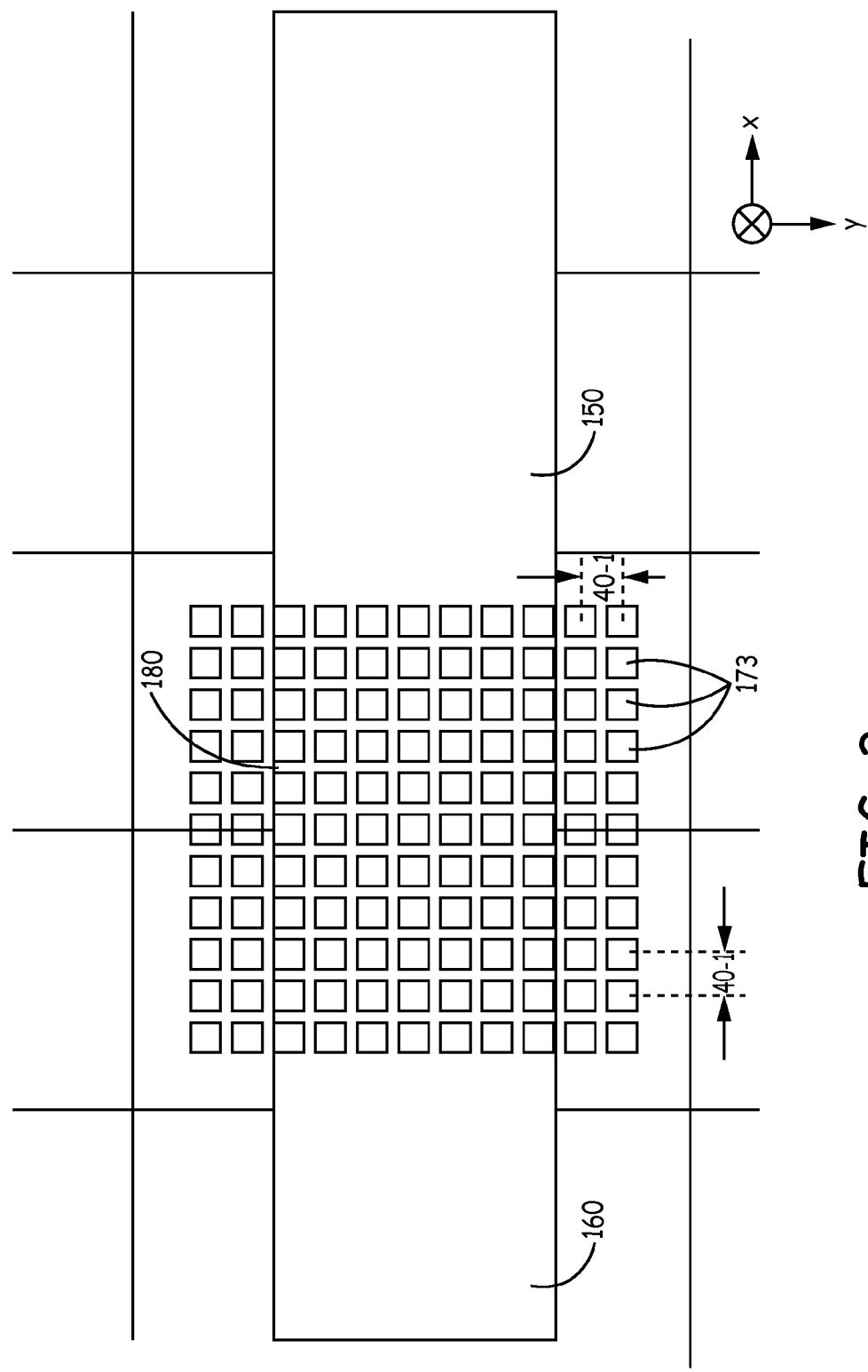
FIGS. 3-6 show various types of grids.
Figure 4:
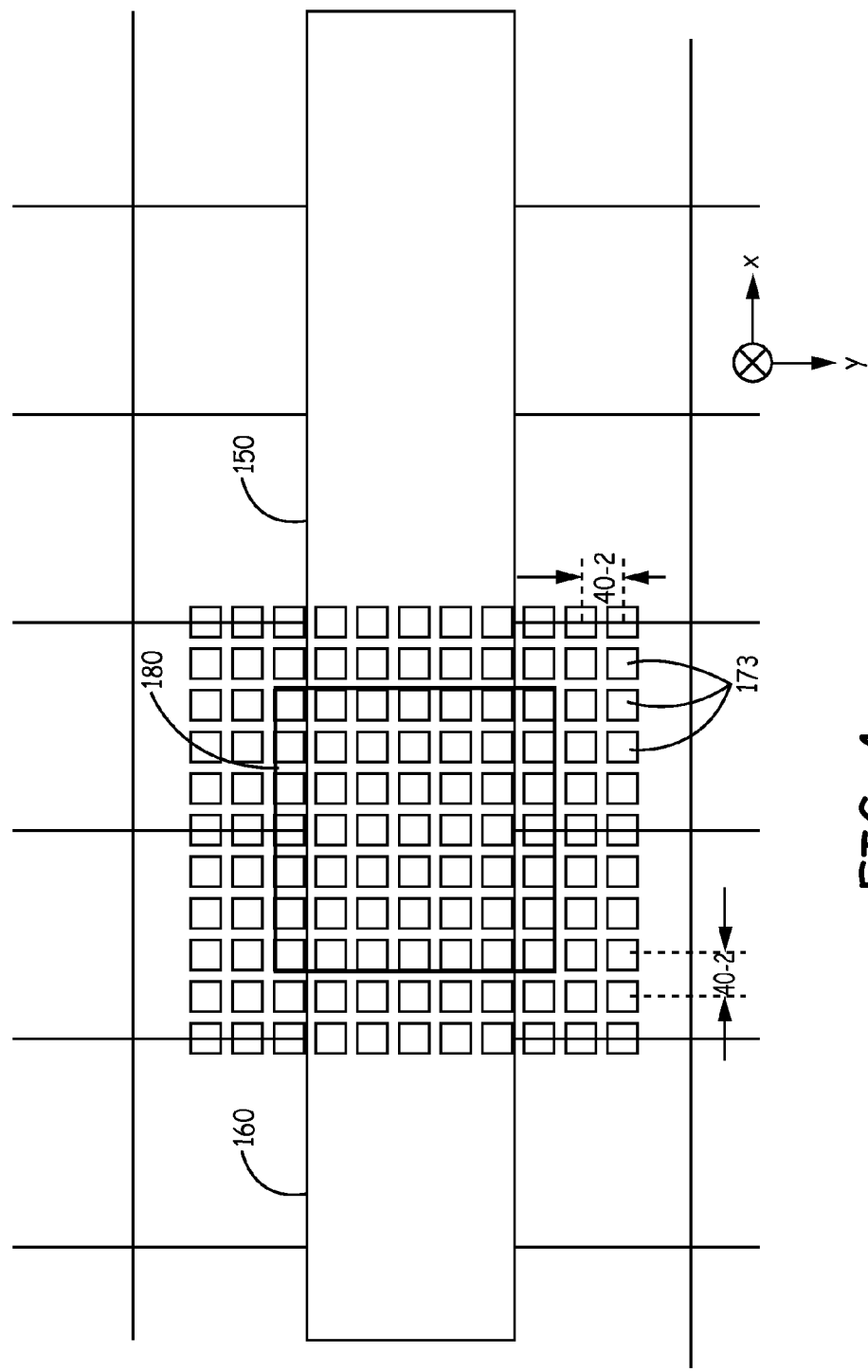
Figure 5:
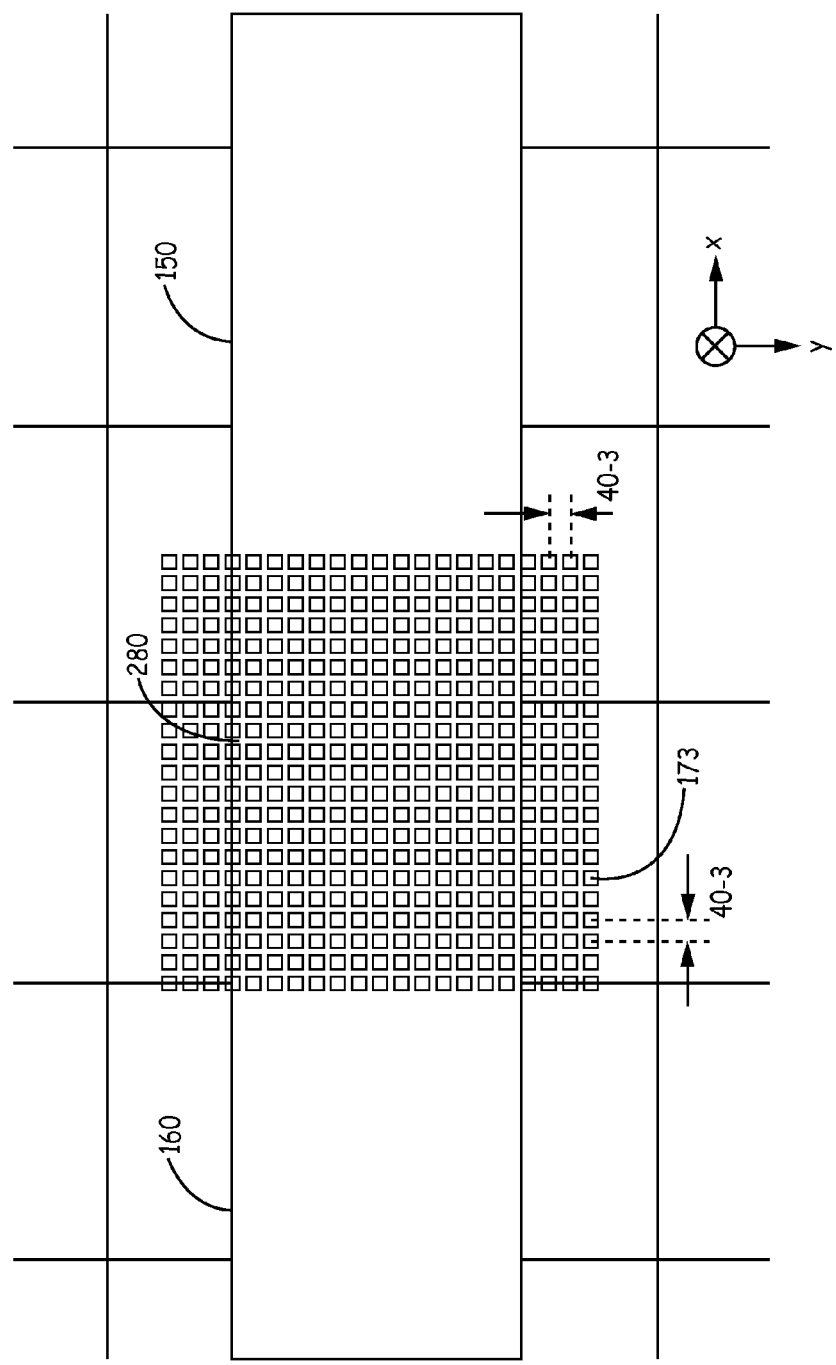
Figure 6:
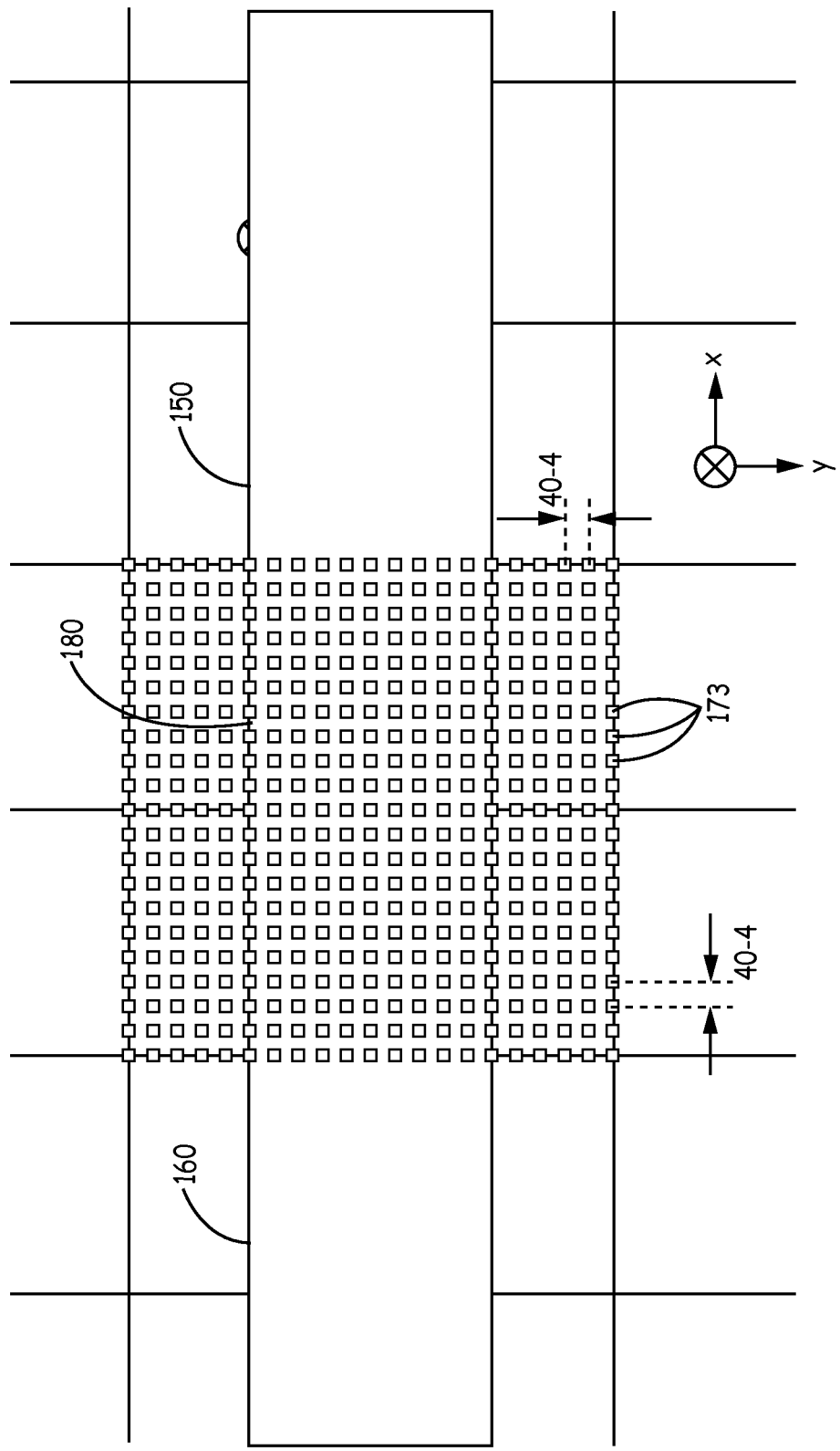
Figure 7:
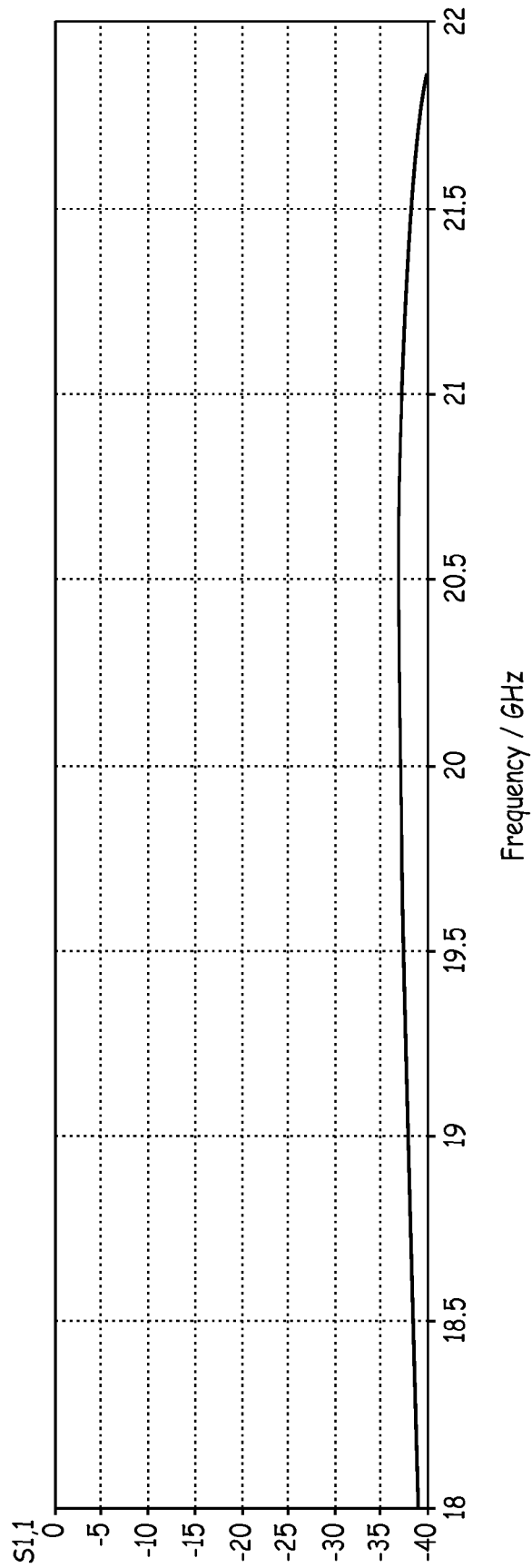
FIGS. 7-10 show plots of the reflection response (S11) as a function of frequency for the grid types of FIGS. 3-6, respectively.
Figure 8:
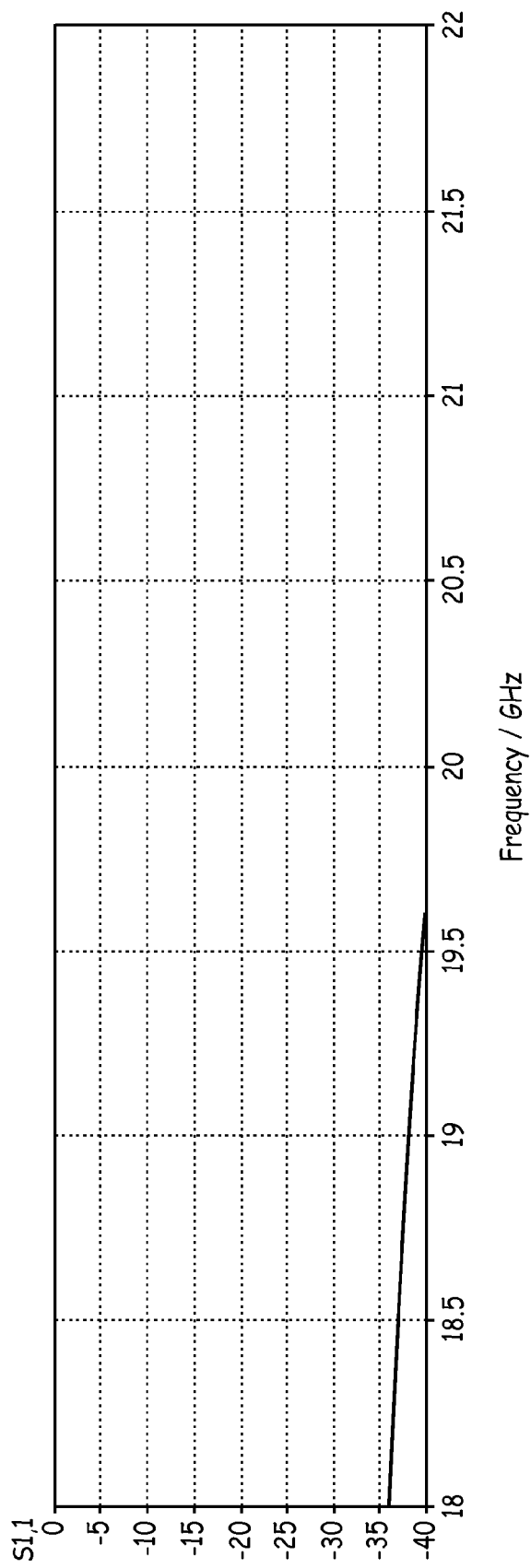
Figure 9:
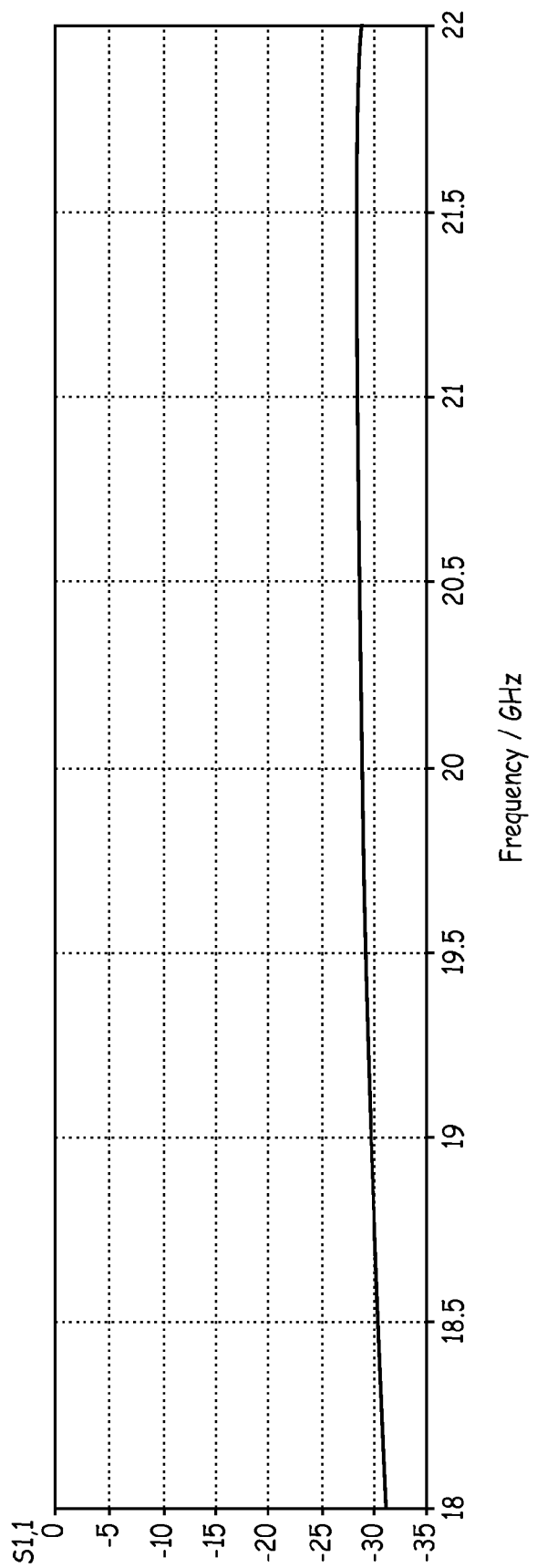
Figure 10:
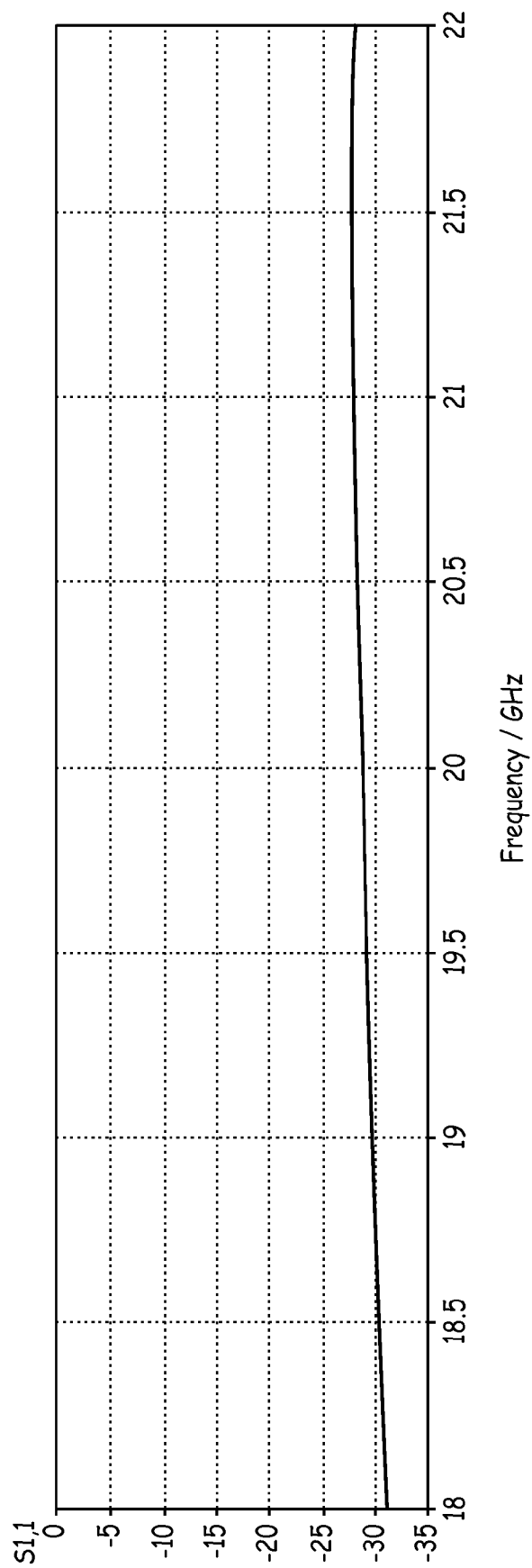
Figure 11:
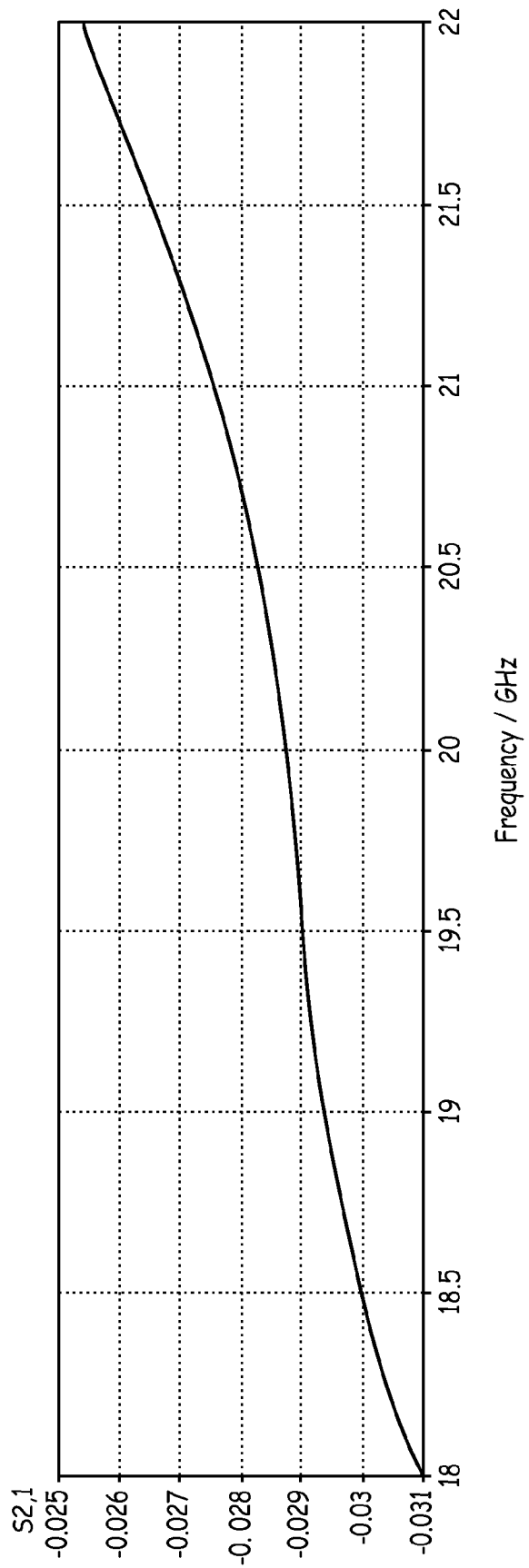
FIGS. 11-14 show plots of the transmission response (S21) as a function of frequency for the grid types of FIGS. 3-6, respectively.
Figure 12:
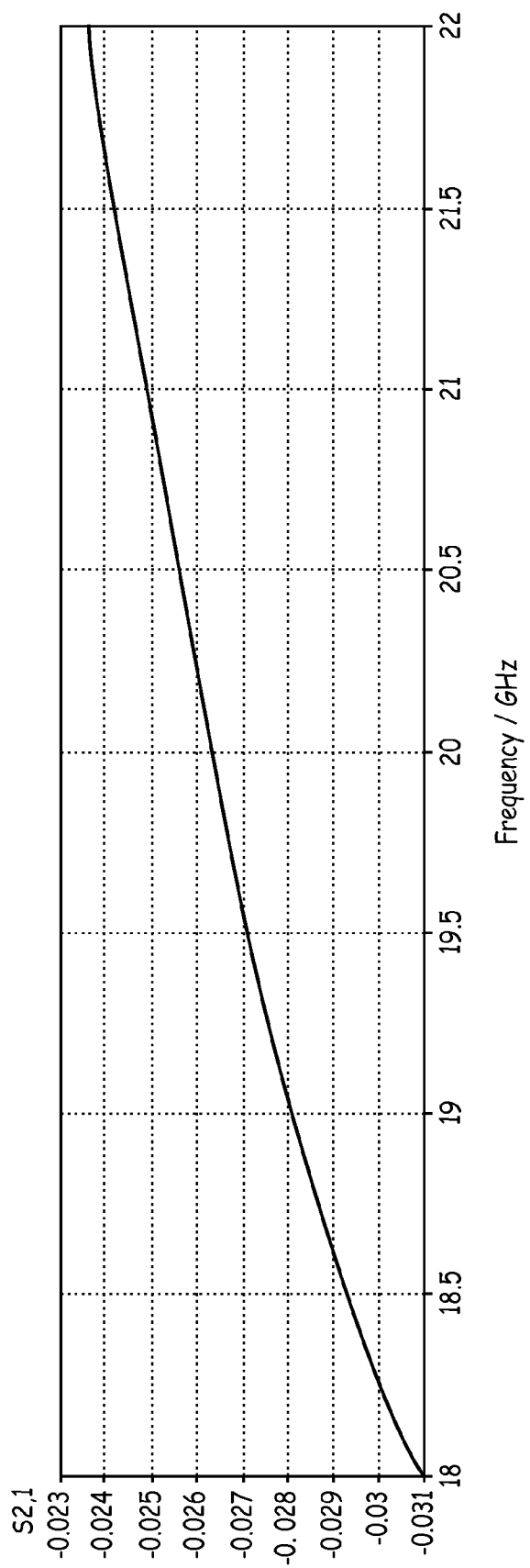
Figure 13:
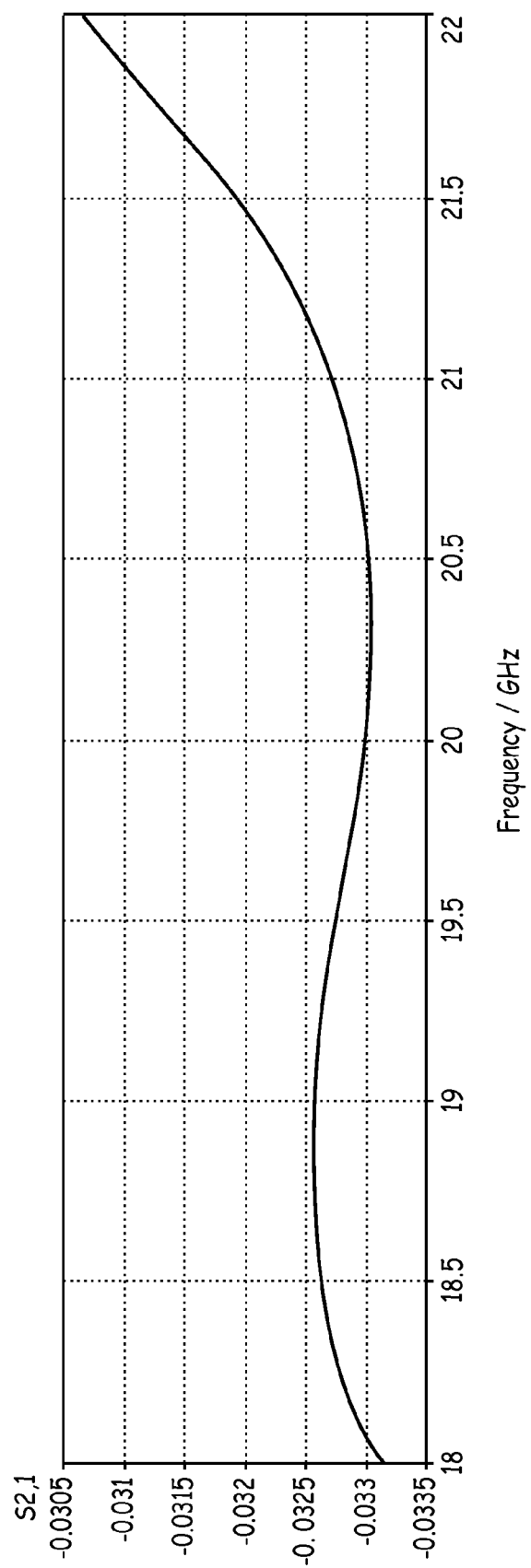
Figure 14:
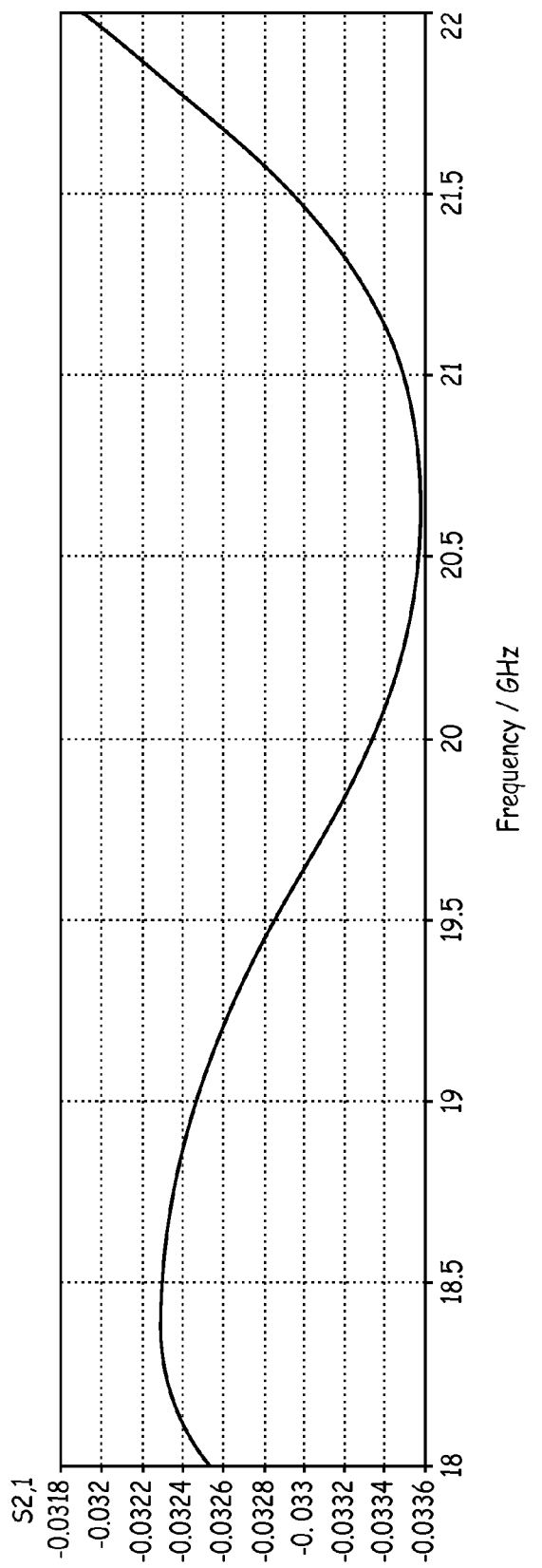

FIG. 3 shows a coarse-close-spaced grid with a 0.1 mm pitch and a 0.05 mm line width. FIG. 4 shows a coarse-wide-spaced grid with a 0.2 mm pitch and a 0.1 mm line width. FIG. 5 shows a fine-close-spaced grid with a 0.075 mm pitch and a 0.025 mm line width. FIG. 6 shows a fine-wide-spaced grid with a 0.15 mm pitch and a 0.05 mm line width. The ground plane with various types of grids is compared to a solid ground plane. Only the coarsest of the grids with the largest spacing required some modification of the microstrip for impedance correction relative to the case without the patterned ground plane.

The area over which the patterned ground plane is used is optimized such that it does not interfere with contact between the cooling device (e.g., TEC 120) and the dielectric substrate 171 under the device to be cooled (e.g., FET 100). The patterned ground plane 171 is one element of an overall thermal control implementation. Many other factors must be considered when designing system to cool a FET 100 with a TEC 120. The TEC 120 has low efficiency in pumping the thermal energy from the cool side 121 to the hot side 122.

In one implementation of this embodiment, the hot side 122 of the TEC 120 is connected to a reflector of an antenna system and the reflector acts as a heat sink to minimize heat rise on the hot side 122. In such a configuration thermal transfer from the PCB 170 to the TEC 120 limits the ability of the TEC 120 to cool the FET 100. Thermal transfer paths include: the ground plane 175; the source microstrip 160; the drain microstrip 150; the ground microstrip 180; the substrate 171; and the air. Detailed thermal analysis of the PCB 170 shows that the copper paths dominate this thermal transfer. Reduction of the thermal transfer through the copper path of the ground plane 175 of the PCB 170 is achieved through the reduced cross-sectional area of the patterned area 172 due to the grids. The cross sectional area of the copper path can be reduced while maintaining desirable RF characteristics.

It is to be noted that the patterned regions can be applied to the ground plane 175 as well as the source microstrip 160 and the drain microstrip 150 as described above with reference to FIG. 2D. The patterning technique can be applied to the entire ground plane and/or microstrip lines or some section of these structures close to the TEC 120 where an increase in thermal resistance has the most impact. Note that the ground plane patterning need not be in the form of a regular grid. Any regular or irregular pattern in the ground surface that increases the thermal resistance from the TEC to the terminating or distributed thermal source could be used. In most cases, ohmic connectivity would be maintained, however structures having periodic or other reactive coupling are also conceivable.

A grid with a density of roughly 50% results in a doubling of the thermal resistance of the copper path from the inside circular perimeter of the grid to the outside circular perimeter of the grid. In practice the density of the grid can be reduced by some arbitrary ratio that is limited only by fabrication and reliability considerations. The scale of the grid would typically, but not necessarily, be selected such that the spacing between grid lines is much less than the wavelength at the highest RF frequency of interest.

If a uniform rectangular grid is formed in the ground plane then the thermal resistance of the path through the ground plane from the TEC to the outer boundary of the grid is increased according to the following mathematical expression:

$$R_{grid} = R_0[t/p + (p-t)/t)],$$

where t is the width of the conductors and p is the pitch (spacing) from conductor to conductor. For example if the pitch is 0.075 mm and the conductor width is 0.025 mm, the thermal resistance is increased by a factor of 2.33.

The width of the thermal path, in the absence of the grid, increases with the circumference about the TEC and, thus, is linearly with distance from the TEC. The grid is thus more effective in the region immediately about the TEC than further out. The cumulative thermal resistance increases with the natural logarithm of the radius from the TEC. For example if the TEC mounting feature has a radius of 3 mm, then a reasonable maximum radius for the grid may be 20 mm since the thermal resistance would be increased by only 30% if this radius were increased to 40 mm.

As shown in FIGS. 7-10, the reflection response (S11) as a function of frequency for the grid types of FIGS. 3-6, respectively, are well below −25 dB. As shown in FIGS. 11-14, the transmission response (S21) as a function of frequency for the grid types of FIGS. 3-6, respectively, is between −0.02 and −0.04. Thus, the grids of FIGS. 3-6 do not degrade the performance of the transmission lines.

Figure 15:
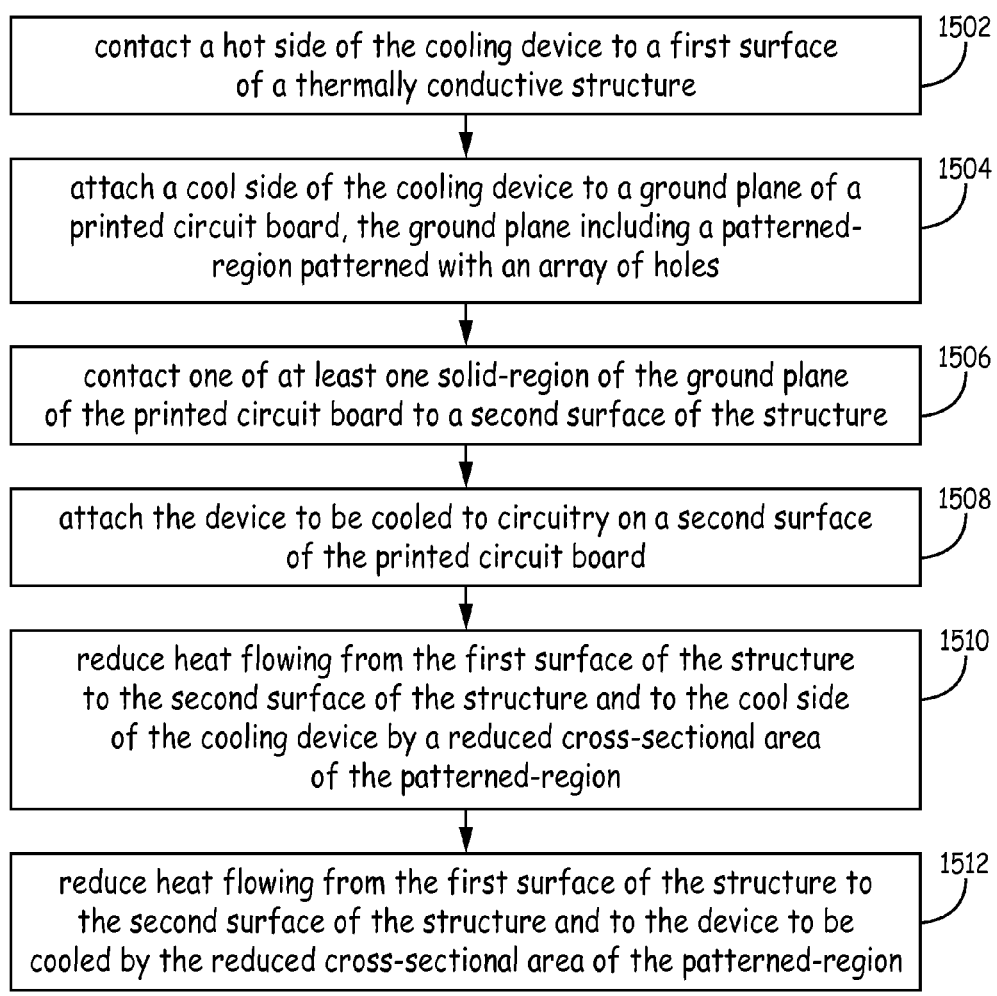
FIG. 15 is a method of reducing transfer of heat from a cooling device to a device to be cooled by the cooling device.

FIG. 15 is a method 1500 of reducing transfer of heat from a cooling device to a device to be cooled by the cooling device. The following description of method 1500 is made with reference to the PCB 170 of FIG. 2A. Method 1500 is applicable to the embodiments of printed circuit boards shown in FIG. 1A, as well as other embodiments as is understandable to one skilled in art upon reading and understanding this document.

At block 1502, a hot side 122 of a cooling device (TEC 120) is contacted to a first surface 145 of a thermally conductive structure 140. The cooling device 120 can also be referred to herein as a Peltier device 120. In one implementation of this embodiment, the first surface 145 of the thermally conductive structure 140 is a bottom surface 145 of a cavity 144 in the structure 140. In this case, a thickness $H_{TEC}$ of the cooling device (TEC 120) is approximately a depth $d_c$ of the cavity 144 in the structure 140 and the contacting the hot side 122 of the cooling device (TEC 120) contacts the bottom surface 145 of the cavity 144. In one implementation of this embodiment, the hot side 122 of the TEC 120 is attached to the bottom surface 145 of the cavity 144 with a thermally conductive adhesive, by soldering, or by other techniques known to one skilled in the art.

At block 1504, a cool side 121 of the cooling device (TEC 120) is attached to a ground plane 175 of a printed circuit board 170. The ground plane 175 includes a patterned-region 172 patterned with an array of holes 173. The attaching can be done by soldering, conductive adhesive or other techniques known to one skilled in the art.

At block 1506, one of at least one solid-region 174-1 of the ground plane 175 of the printed circuit board 170 contacts a second surface 146 of the structure. The one of at least one solid-region of the ground plane surrounds an outer perimeter 178 of the patterned-region 172. In one implementation of this embodiment, the functions of blocks 1504 and 1506 are accomplished by placing the printed circuit board 170 over the cavity 144 and attaching (with a thermally conductive material) the first-solid-region 174-1 of the ground plane 175 to the second surface 146 of the structure 140.

At block 1508, the device to be cooled (FET 100) is attached to circuitry (e.g., source microstrip 160, a drain micro-strip 150) on the second surface 182 of the printed circuit board 170. The second surface 182 of the printed circuit board 170 opposes the first surface 181 of the printed circuit board 170. It is to be noted that electromagnetic waves propagate in the source microstrip 160 and the drain microstrip 150. In one implementation of this embodiment, the array of holes 173 patterned in the patterned-region 172 of ground plane 170 have a pitch in which the spacing between neighboring holes 173 is less than a quarter of wavelength of the electromagnetic wave propagating in the source microstrip 160 and the drain microstrip 150. In another implementation of this embodiment, the source microstrip 160 and the drain microstrip 150 are configured with circuitry-patterned-regions as shown in FIG. 2D.

At block 1510, heat 50 flowing from the first surface 145 of the structure 140 to the second surface 146 of the structure 140 and to the cool side 121 of the cooling device 120 is reduced by a reduced cross-sectional area of the patterned-region 172. Likewise, at block 1512, heat 50 flowing from the first surface 145 of the structure 144 to the second surface 146 of the structure 144 and to the device 120 to be cooled is reduced by the reduced cross-sectional area of the patterned-region 172. In this manner, the transfer of heat from a cooling device to a device to be cooled by the cooling device is reduced.

Figure 16:
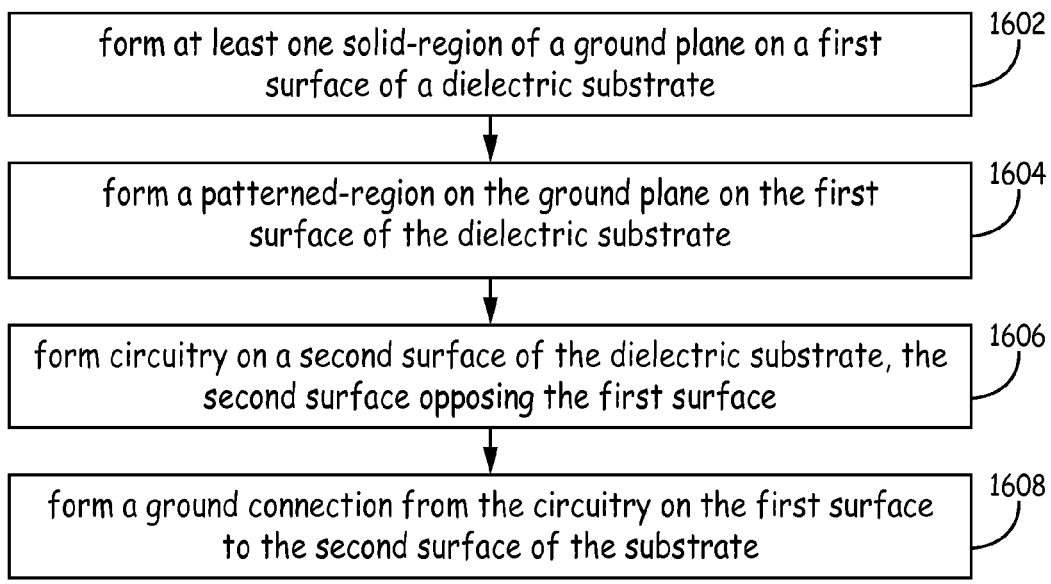
FIG. 16 is a method of forming a printed circuit board configured to prevent heat from a cooling device from degrading performance of at least one device to be cooled.

FIG. 16 is a method of forming a printed circuit board configured to prevent heat from a cooling device from degrading performance of at least one device to be cooled. The following description of method 1600 is made with reference to the PCB 170 of FIG. 2A. Method 1600 is applicable to the embodiments of printed circuit boards shown in FIG. 1A as well as other embodiments as is understandable to one skilled in art upon reading and understanding this document.

At block 1602, at least one solid-region 174 of a ground plane 185 (FIG. 2C) is formed on a first surface 181 of a dielectric substrate 171. In one implementation of this embodiment, a first-solid-region 174-1 and a second-solidregion 174-2 (FIG. 2B) are formed of a ground plane 175 on a first surface 181 of a dielectric substrate 171.

At block 1604, a patterned-region 172 is formed on the ground plane 175 on the first surface 181 of the dielectric substrate 171. The patterned-region 172 abruptly transitions from the first-solid-region 174-1 at perimeter 179. If there is a second-solid-region 174-2 (FIG. 2B) are formed of a ground plane 175, then the patterned-region 172 abruptly transitions from the second-solid-region 174-2 at perimeter 178.

In one implementation of this embodiment, the at least one solid-region 174 of a ground plane 185 is formed by depositing a layer of metal (e.g., copper) on the first surface 181 of the dielectric substrate 171. The patterned-region is formed on the ground plane 175 by etching an array of holes 173 in the deposited layer of metal. The etching is configured so the array of holes 173 is surrounded by the solid-region 174. In one implementation of this embodiment, the etching is configured so the array of holes 173 is surrounded by a first-solid-region 174-1 and surrounds a second-solid-region 174-2.

At block 1606, circuitry (e.g., circuitry 260 or a source microstrip 160 and a drain micro-strip 150) is formed on a second surface 182 of the dielectric substrate 171. The circuitry 260 is formed by depositing a layer of metal (e.g., copper) on the second surface 182 of the dielectric substrate 171 and then patterning the layer of metal on the second surface 182 to form the source microstrip 160 and the drain micro-strip 150. The patterning is done by one of the various techniques known to one skilled in the art. In one implementation of this embodiment, the source microstrip 160 and the drain micro-strip 150 are additionally patterned by etching an array 161 and 151 of holes 373 and 473 in at least a portion of the respective source microstrip 160 and the drain micro-strip 150 as shown in FIG. 2D.

At block 1608, a ground connection 180 is formed from the circuitry (e.g., source microstrip 160, a drain micro-strip 150) on the first surface 181 to the second surface 182 of the substrate 171. In one implementation of this embodiment, a via is formed in the dielectric substrate 171 before the circuits are formed on the surface 182 of the dielectric substrate 171. In another implementation of this embodiment, the via formed in the dielectric substrate 171 is filled with a metal before the circuits are formed on the surface 182 of the dielectric substrate 171.

EXAMPLE EMBODIMENTS

Example 1 includes a printed circuit board for use with a cooling device configured to cool at least one device, the at least one device being at least one of an electronic device, an optical device, an electro-optic device, and a magnetic device, the printed circuit board comprising: a substrate having a first surface and a second surface opposing the first surface: a ground plane on the first surface of the substrate, the ground plane including a patterned-region that is patterned with an array of holes; and circuitry in a circuit-region on the second surface of the substrate, the circuitry configured for use with the at least one device to be cooled, wherein, when a first side of the cooling device contacts the ground plane, and when the at least one device to be cooled contacts the circuitry, a reduced cross-sectional area of the patterned-region prevents heat from a second side of the cooling device from degrading performance of the at least one device.

Example 2 includes the printed circuit board of Example 1, wherein the ground plane further includes at least one solid-region surrounding the patterned-region.

Example 3 includes the printed circuit board of Example 2, wherein the at least one solid-region includes: a first-solid-region surrounding an outer perimeter of the patterned-region, and a second-solid-region surrounded by an inner perimeter of the patterned-region.

Example 4 includes the printed circuit board of Example 3, wherein the first side of the cooling device is a cool side, the second side of the cooling device is a hot side, wherein when the printed circuit board is operably positioned on a thermally conductive structure, wherein heat generated at the hot side of the cooling device is thermally conducted to the first-solid-region of the ground plane, and wherein the reduced cross-sectional area of the patterned-region mitigates the flow of heat to: the device to be cooled, and the cool side of the cooling device.

Example 5 includes the printed circuit board of any of Examples 3-4, further comprising: a ground connection electrically connecting the circuitry to the second-solid-region of the ground plane through the substrate.

Example 6 includes the printed circuit board of Example 2, wherein the at least one solid-region surrounding the patterned-region is a single solid-region, the printed circuit board further comprising: a ground connection electrically connecting the circuitry to the patterned-region of the ground plane through the substrate.

Example 7 includes the printed circuit board of Example 6, wherein the first side of the cooling device is a cool side, the second side of the cooling device is a hot side, wherein when the printed circuit board is operably positioned on a thermally conductive structure, heat generated at the hot side of the cooling device is thermally conducted to the at least one solid-region of the ground plane, and wherein the reduced cross-sectional area of the patterned-region mitigates the flow of heat to: the device to be cooled, and the cool side of the cooling device.

Example 8 includes the printed circuit board of any of Examples 1-7, wherein the at least one device is a field effect transistor (FET) in a low noise amplifier, wherein the circuitry includes a source microstrip, and a drain microstrip, and wherein a pitch of the array of holes patterned in the patterned-region of ground plane is less than a quarter of wavelength of the electromagnetic wave propagating in the source microstrip and the drain microstrip.

Example 9 includes the printed circuit board of Example 8, wherein the cooling device is a Peltier device thermoelectrically cooling the field effect transistor (FET) in a thermally conductive structure.

Example 10 includes the printed circuit board of any of Examples 8-9, wherein the circuitry in the circuit-region on the second surface of the substrate includes a circuitry-patterned-region that is patterned with an array of holes.

Example 11 includes a method to reduce transfer of heat from a cooling device to a device to be cooled by the cooling device, the method comprising: contacting a hot side of the cooling device to a first surface of a thermally conductive structure; attaching a cool side of the cooling device to a ground plane of a printed circuit board, wherein the ground plane includes a patterned-region patterned with an array of holes; contacting one of at least one solid-region of the ground plane of the printed circuit board to a second surface of the structure, wherein the one of at least one solid-region of the ground plane surrounds an outer perimeter of the patterned-region; attaching the device to be cooled to circuitry on a second surface of the printed circuit board, the second surface of the printed circuit board opposing the first surface of the printed circuit board; reducing heat flowing from the first surface of the structure to the second surface of the structure and to the cool side of the cooling device by a reduced cross-sectional area of the patterned-region; and reducing heat flowing from the first surface of the structure to the second surface of the structure and to the device to be cooled by the reduced cross-sectional area of the patterned-region.

Example 12 includes the method of Example 11, wherein the first surface of the thermally conductive structure is a bottom surface of a cavity in the structure, and wherein a thickness of the cooling device is approximately a depth of the cavity in the structure, wherein: contacting the hot side of the cooling device to the first surface of the thermally conductive structure comprises: contacting the hot side of the cooling device to the bottom surface of the cavity, and wherein attaching the cool side of the cooling device to the at least a portion of the patterned-region, and contacting the one of at least one solid-region of the ground plane of the printed circuit board to the second surface of the structure comprises: placing the printed circuit board over the cavity; and attaching one of the at least one solid-region of the ground plane to the second surface of the structure.

Example 13 includes the method of 11, wherein contacting the hot side of the cooling device to the first surface of the thermally conductive structure comprises: contacting the hot side of a Peltier device to the first surface of the thermally conductive structure, wherein attaching the cool side of the cooling device to at least the portion of the patterned-region of the ground plane of the printed circuit board comprises: attaching the cool side of the Peltier device to at least the portion of the patterned-region of the ground plane of the printed circuit board, wherein attaching the device to be cooled to circuitry on the second surface of the printed circuit board comprises: attaching a field effect transistor (FET) to be cooled to a source microstrip, drain micro-strip, and a ground connection, wherein the ground connection extends through a substrate of the printed circuit board to contact the ground plane, the method further comprising: terminating electromagnetic waves propagating in the source microstrip and the drain microstrip in the array of holes patterned in the patterned-region of ground plane, wherein a pitch of the spacing is less than a quarter of wavelength of the electromagnetic wave propagating in the source microstrip and the drain microstrip.

Example 14 includes the method of any of Examples 11-13, wherein attaching the device to be cooled to the circuitry on the second surface of the printed circuit board includes attaching the device to a ground connection, extending through a substrate of the printed circuit board to contact the ground plane.

Example 15 includes the method of any of Examples 11-14, wherein the one of at least one solid-region of the ground plane includes a first-solid-region surrounding an outer perimeter of the patterned-region, and a second-solid-region surrounded by an inner perimeter of the patterned-region, wherein attaching the cool side of the cooling device to the at least the portion of the patterned-region of the ground plane comprises: attaching the cool side of the cooling device to the at least a portion of the patterned-region of the ground plane; and attaching the cool side of the cooling device to the second-solid-region.

Example 16 includes the method of Example 15, wherein contacting the one of at least one solid-region of the ground plane of the printed circuit board to the second surface of the structure comprises: contacting the first-solid-region of the ground plane to the second surface of the structure.

Example 17 includes the method of any of Examples 15-16, wherein the first surface of the thermally conductive structure is a bottom surface of a cavity in the structure, and wherein a thickness of the cooling device is approximately a depth of the cavity in the structure, wherein: contacting the hot side of the cooling device to the first surface of the thermally conductive structure comprises: contacting the hot side of the cooling device to the bottom surface of the cavity, and wherein attaching the cool side of the cooling device to the at least a portion of the patterned-region, and contacting the one of at least one solid-region of the ground plane of the printed circuit board to the second surface of the structure comprises: placing the printed circuit board over the cavity; and attaching one of the at least one solid-region of the ground plane to the second surface of the structure, where the method further comprises: terminating electromagnetic waves propagating in the source microstrip and the drain microstrip in the array of holes patterned in the patterned-region of ground plane, wherein a pitch of the spacing is less than a quarter of wavelength of the electromagnetic wave propagating in a dielectric substrate of the printed circuit board.

Example 18 includes a method of forming a printed circuit board configured to prevent heat from a cooling device from degrading performance of at least one device to be cooled, the method comprising: forming at least one solid-region of a ground plane on a first surface of a dielectric substrate; forming a patterned-region on the ground plane on the first surface of the dielectric substrate, wherein the patterned-region abruptly transitions from the at least one solid-region; forming circuitry on a second surface of the dielectric substrate, the second surface opposing the first surface; and forming a ground connection from the circuitry on the first surface to the second surface of the substrate.

Example 19 includes the method of Example 18, wherein forming the at least one solid-region of a ground plane on a first surface of a substrate comprises: depositing a layer of metal on the first surface of the dielectric substrate, wherein forming a patterned-region on the ground plane comprises: etching an array of holes in the deposited layer of metal, the array of holes being surrounded by the at least one solid-region.

Example 20 includes the method of any of Examples 18-19, wherein forming the circuitry on a second surface of the dielectric substrate comprises: depositing a layer of metal on the second surface of the dielectric substrate, patterning the layer of metal on the second surface to form the circuitry; and etching an array of holes in at least a portion of the circuitry.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A printed circuit board (PCB) for use with a cooling device configured to cool at least one device, the at least one device being at least one of an electronic device, an optical device, an electro-optic device, and a magnetic device, the PCB comprising:
   a substrate having a first surface and a second surface opposing the first surface;

a ground plane on the first surface of the substrate, the ground plane including a patterned-region that is patterned with an array of holes with some desired ratio of metal to gap; and circuitry in a circuit-region on the second surface of the substrate, the circuitry configured for use with the at least one device to be cooled, wherein, when a first side of the cooling device contacts the ground plane, and when the at least one device to be cooled contacts the circuitry, a reduced cross-sectional area of the patterned-region in the ground plane increases the thermal resistance of the patterned-region reducing thermal transfer, thereby reducing degradation of a performance of the at least one device.

2. The printed circuit board of claim 1, wherein the ground plane further includes at least one solid-region surrounding the patterned-region.

3. The printed circuit board of claim 2, wherein the at least one solid-region includes:

a first-solid-region surrounding an outer perimeter of the patterned-region; and a second-solid-region surrounded by an inner perimeter of the patterned-region.

4. The printed circuit board of claim 3, wherein the first side of the cooling device is a cool side, the second side of the cooling device is a hot side, wherein when the printed circuit board is operably positioned on a thermally conductive structure, wherein heat generated at the hot side of the cooling device is thermally conducted to the first-solid-region of the ground plane, and wherein the reduced cross-sectional area of the patterned-region mitigates the flow of heat to: the device to be cooled, and the cool side of the cooling device.

5. The printed circuit board of claim 3, further comprising:

a ground connection electrically connecting the circuitry to the second-solid-region of the ground plane through the substrate.

6. The printed circuit board of claim 2, wherein the at least one solid-region surrounding the patterned-region is a single solid-region, the printed circuit board further comprising:

a ground connection electrically connecting the circuitry to the patterned-region of the ground plane through the substrate.

7. The printed circuit board of claim 6, wherein the first side of the cooling device is a cool side, the second side of the cooling device is a hot side, wherein when the printed circuit board is operably positioned on a thermally conductive structure, heat generated at the hot side of the cooling device is thermally conducted to the at least one solid-region of the ground plane, and wherein the reduced cross-sectional area of the patterned-region mitigates the flow of heat to: the device to be cooled, and the cool side of the cooling device.

8. The printed circuit board of claim 1, wherein the at least one device is a field effect transistor (FET) in a low noise amplifier, wherein the circuitry includes a source microstrip, and a drain microstrip, and wherein a pitch of the array of holes patterned in the patterned-region of ground plane is less than a quarter of wavelength of the electromagnetic wave propagating in the source microstrip and the drain microstrip.

9. The printed circuit board of claim 8, wherein the cooling device is a Peltier device thermoelectrically cooling the field effect transistor (FET) in a thermally conductive structure.

10. The printed circuit board of claim 8, wherein the circuitry in the circuit-region on the second surface of the substrate includes a circuitry-patterned-region that is patterned with an array of holes.

* * * * *